US010340383B2

(12) United States Patent
Lan et al.

(10) Patent No.: US 10,340,383 B2
(45) Date of Patent: Jul. 2, 2019

(54) SEMICONDUCTOR DEVICE HAVING STRESSOR LAYER

(71) Applicants: TAIWAN SEMICONDUCTOR MANUFACTURING CO., LTD., Hsinchu (TW); NATIONAL TAIWAN UNIVERSITY, Taipei (TW)

(72) Inventors: Huang-Siang Lan, Kaohsiung (TW); CheeWee Liu, Taipei (TW); Chi-Wen Liu, Hsinchu (TW); Shih-Hsien Huang, Yilan County (TW); I-Hsieh Wong, Kaohsiung (TW); Hung-Yu Yeh, Taichung (TW); Chung-En Tsai, Hsinchu County (TW)

(73) Assignees: TAIWAN SEMICONDUCTOR MANUFACTURING CO., LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 15/277,079

(22) Filed: Sep. 27, 2016

(65) Prior Publication Data

US 2017/0278968 A1 Sep. 28, 2017

Related U.S. Application Data

(60) Provisional application No. 62/313,692, filed on Mar. 25, 2016.

(51) Int. Cl.
*H01L 29/78* (2006.01)
*H01L 29/08* (2006.01)
(Continued)

(52) U.S. Cl.
CPC .... *H01L 29/7849* (2013.01); *H01L 21/02535* (2013.01); *H01L 21/823807* (2013.01);
(Continued)

(58) Field of Classification Search
CPC ... H01L 29/1054; H01L 29/7842–7849; H01L 29/7949; H01L 21/02535;
(Continued)

(56) References Cited

U.S. PATENT DOCUMENTS 7,425,740 B2   9/2008  Liu et al.
7,667,271 B2   2/2010  Yu et al.
(Continued)

OTHER PUBLICATIONS

B. Vincent et al., "Undoped and in-situ B doped GeSn epitaxial growth on Ge by atmospheric pressure-chemical vapor deposition", Applied Physics Letters, 99, 152103-1-152103-3, 2011.
(Continued)

*Primary Examiner* — Matthew C Landau
*Assistant Examiner* — Mark Hatzilambrou
(74) *Attorney, Agent, or Firm* — McDermott Will & Emery LLP

(57) ABSTRACT

A semiconductor device includes a fin extending along a first direction over a substrate, and a gate structure extending in a second direction overlying the fin. The gate structure includes a gate dielectric layer overlying the fin, a gate electrode overlying the gate dielectric layer, and insulating gate sidewalls on opposing lateral surfaces of the gate electrode extending along the second direction. A source/drain region is formed in the fin in a region adjacent the gate electrode structure, and a stressor layer is between the source/drain region and the semiconductor substrate. The stressor layer includes GeSn or SiGeSn containing $10^{19}$ atoms $cm^{-3}$ or less of a dopant, and a portion of the fin under the gate structure is a channel region.

20 Claims, 66 Drawing Sheets

(51) Int. Cl.
- *H01L 29/10* (2006.01)
- *H01L 29/165* (2006.01)
- *H01L 27/092* (2006.01)
- *H01L 21/02* (2006.01)
- *H01L 21/8238* (2006.01)
- *H01L 29/66* (2006.01)

(52) U.S. Cl.
CPC ........ *H01L 21/823821* (2013.01); *H01L 21/823828* (2013.01); *H01L 21/823864* (2013.01); *H01L 27/0924* (2013.01); *H01L 29/0847* (2013.01); *H01L 29/1033* (2013.01); *H01L 29/165* (2013.01); *H01L 29/66545* (2013.01)

(58) Field of Classification Search
CPC ..... H01L 21/823807; H01L 21/823821; H01L 27/0924; H01L 29/0847; H01L 29/1033; H01L 29/165
See application file for complete search history.

(56) References Cited

U.S. PATENT DOCUMENTS

| | | | |
|---|---|---|---|
| 8,048,723 B2 | 11/2011 | Chang et al. | |
| 8,053,299 B2 | 11/2011 | Xu | |
| 8,183,627 B2 | 5/2012 | Currie | |
| 8,362,575 B2 | 1/2013 | Kwok et al. | |
| 8,367,498 B2 | 2/2013 | Chang et al. | |
| 8,415,718 B2 | 4/2013 | Xu | |
| 8,440,517 B2 | 5/2013 | Lin et al. | |
| 8,497,177 B1 | 7/2013 | Chang et al. | |
| 8,497,528 B2 | 7/2013 | Lee et al. | |
| 8,609,518 B2 | 12/2013 | Wann et al. | |
| 8,610,240 B2 | 12/2013 | Lee et al. | |
| 8,618,556 B2 | 12/2013 | Wu et al. | |
| 8,633,516 B1 | 1/2014 | Wu et al. | |
| 8,680,576 B2 | 3/2014 | Ching et al. | |
| 8,703,565 B2 | 4/2014 | Chang et al. | |
| 8,723,272 B2 | 5/2014 | Liu et al. | |
| 8,729,627 B2 | 5/2014 | Cheng et al. | |
| 8,729,634 B2 | 5/2014 | Shen et al. | |
| 8,742,509 B2 | 6/2014 | Lee et al. | |
| 8,776,734 B1 | 7/2014 | Roy et al. | |
| 8,785,285 B2 * | 7/2014 | Tsai | H01L 29/66795 257/E21.409 |
| 8,796,666 B1 | 8/2014 | Huang et al. | |
| 8,796,759 B2 | 8/2014 | Perng et al. | |
| 8,809,139 B2 | 8/2014 | Huang et al. | |
| 8,815,712 B2 | 8/2014 | Wan et al. | |
| 8,828,823 B2 | 9/2014 | Liu et al. | |
| 8,836,016 B2 | 9/2014 | Wu et al. | |
| 8,841,701 B2 | 9/2014 | Lin et al. | |
| 8,847,293 B2 | 9/2014 | Lee et al. | |
| 8,853,025 B2 | 10/2014 | Zhang et al. | |
| 9,129,863 B2 | 9/2015 | Caimi et al. | |
| 2008/0197412 A1* | 8/2008 | Zhang | H01L 29/0847 257/344 |
| 2011/0068407 A1 | 3/2011 | Yeh et al. | |
| 2013/0011983 A1 | 1/2013 | Tsai et al. | |
| 2013/0049101 A1* | 2/2013 | Hsiao | H01L 29/66636 257/329 |
| 2013/0285153 A1 | 10/2013 | Lee et al. | |
| 2014/0183600 A1 | 7/2014 | Huang et al. | |
| 2014/0252412 A1 | 9/2014 | Tsai et al. | |
| 2014/0264590 A1* | 9/2014 | Yu | H01L 29/66795 257/344 |
| 2014/0264592 A1 | 9/2014 | Oxland et al. | |
| 2014/0374834 A1* | 12/2014 | Luo | H01L 27/0924 257/369 |
| 2015/0263003 A1 | 9/2015 | Lee et al. | |
| 2016/0027877 A1* | 1/2016 | Lee | H01L 29/0692 257/191 |
| 2016/0087099 A1* | 3/2016 | Moroz | H01L 29/66795 257/190 |
| 2017/0047446 A1* | 2/2017 | Margetis | H01L 29/7848 |

OTHER PUBLICATIONS

G. Impellizzeri et al., "Ga-implantation in Ge: Electrical activation and clustering", Journal of Applied Physics 106, 013518-1-013518-6, 2009.

G. Impellizzeri et al., "B activation and clustering in ion-implanted Ge", Journal of Applied Physics, 105, 063533-1-063533-6, 2009.

S. Gupta et al., "Towards High Mobility GeSn Channel nMOSFETs: Improved Surface Passivation Using Novel Ozone Oxidation Method", IEEE 2012, pp. 16.2.1-16.2.4.

S. Mirabella et al., "Activation and carrier mobility in high fluence B implanted germanium", Applied Physics Letters, vol. 92, (2008), pp. 1-3.

S. Gupta et al., "A Group IV Solution for 7 nm FinFET CMOS: Stress Engineering Using Si, Ge and Sn", IEEE, IEDM, vol. 13, No. 641, (2013), pp. 1-4.

C. Auth et al., "A 22nm High Performance and Low-Power CMOS Technology Featuring Fully-Depicted Tri-Gate Transistors, Self-Aligned Contacts and High Density MIM Capacitors", Symposium on VLSI Technology (2012), pp. 1-2.

Y. Shimura et al., "In-situ Ga doping of fully strained Ge1-xSnx heteroepitaxial layers grown on Ge(001) substrates", Thin Solid Films, vol. 520, (2012), pp. 3206-3210.

Dmitri Nikonov (intel, 2013), "Course on Beyond CMOS Computing," https://nanohub.org/resources/18347.

Tutorial IEDM 2015: Advance Device Concepts for 7nm Node and Beyond.

* cited by examiner

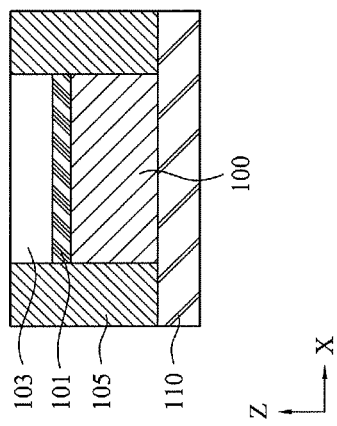
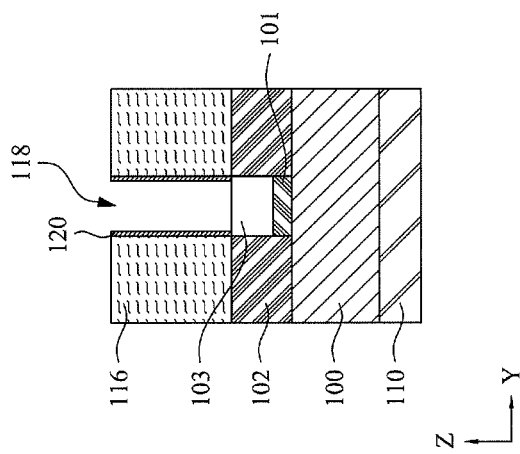
FIG. 44B
FIG. 44A

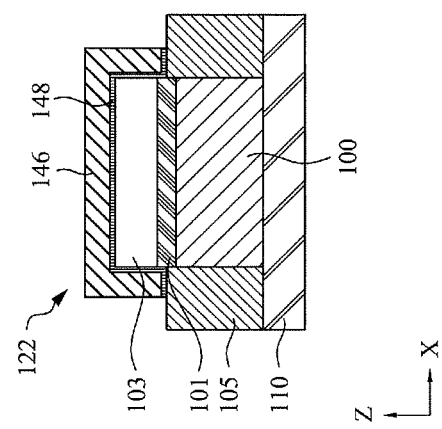
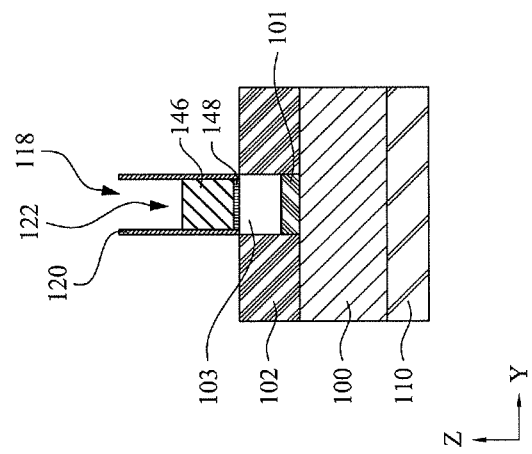
FIG. 46A
FIG. 46B

SEMICONDUCTOR DEVICE HAVING STRESSOR LAYER

CROSS REFERENCE TO PROVISIONAL APPLICATIONS

This application claims priority from U.S. provisional patent application Ser. No. 62/313,692; filed Mar. 25, 2016, the entire disclosure of which is incorporated herein by reference.

TECHNICAL FIELD

The disclosure relates to semiconductor integrated circuits, more particularly to semiconductor devices having fin field effect transistor (FinFET) structures and its manufacturing process.

BACKGROUND

The electron and hole mobility of Ge-based FETs can be enhanced by applying tensile and compressive strain, respectively. GeSn and SiGe have been proposed for use as source/drain stressors for a Ge-based P-type FET (PFET) and N-type FET (NFET), however, heavy doping of the source/drain stressors was required.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 39-46B depict a method for manufacturing a semiconductor device according to an embodiment of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

It is desirable to enhance electron and hole mobility of Ge-based FETs by applying tensile and compressive strain, respectively. Strain can be introduced into a P-type FET in some embodiments of the present disclosure by use of a stressor layer between the source/drain regions and the semiconductor substrate. Strain can be introduced into an N-type FET in some embodiments of the present disclosure by use of a stressor layer between the channel region and the semiconductor substrate.

Figure 1C:
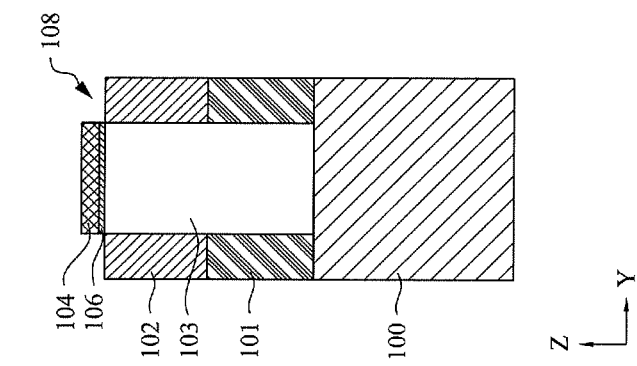
FIGS. 1A-1C depict a semiconductor device according to an embodiment of the present disclosure.
Figure 1B:
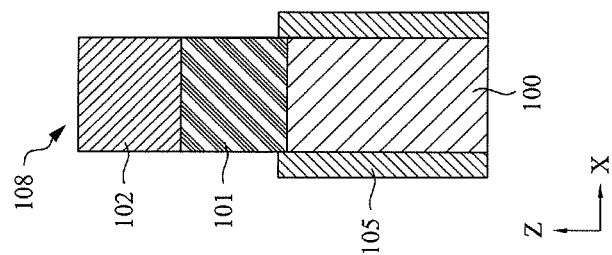
Figure 1A:
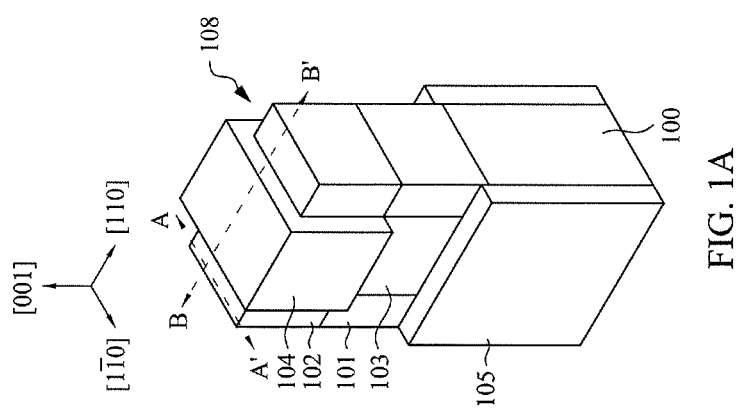

FIGS. 1A-1C depict a P-type FinFET semiconductor device according to an embodiment of the present disclosure. FIG. 1A is an isometric view of the semiconductor device, FIG. 1B is a cross section corresponding to line A-A' in FIG. 1A, and FIG. 1C is a cross section corresponding to line B-B' in FIG. 1A.

Adverting to FIG. 1A, a fin 108 is formed on a semiconductor substrate (not shown) extending in a first direction (the B-B' direction) and a gate electrode 104 overlies the fin 108 extending in a second direction (the A-A' direction). In some embodiments, the second direction is substantially perpendicular to the first direction. The semiconductor device includes a strain relaxed buffer layer 100 formed on a semiconductor substrate (not shown). A channel region 103 of the fin 108 is formed over the strain relaxed buffer layer 100. A gate dielectric layer 106 is formed between the gate electrode 104 and the channel region 103. Source/drain regions 102 are formed on the fin 108 on both sides of the channel region 103 along the B-B' direction. Stressor layers 101 are formed between the source/drain regions 102 and the strain relaxed buffer layer 100 on both sides of the channel region 103 along the B-B' direction. Shallow trench isolation regions 105 are formed on both sides of the fin 108 along the A-A' direction. In some embodiments of the disclosure, a plurality of fins 108 separated by shallow trench isolation regions 105 are formed on the semiconductor substrate.

In certain embodiments, the stressor layers 101 include GeSn or SiGeSn. In some embodiments, the stressor layer 101 includes GeSn or SiGeSn containing less than $10^{19}$ atoms cm$^{-3}$ of a dopant. In other embodiments, the stressor layer 101 includes GeSn or SiGeSn containing less than $10^{18}$ atoms cm$^{-3}$ of the dopant. The stressor layer 101 includes undoped GeSn or undoped SiGeSn in other embodiments. The dopants in the doped GeSn and SiGeSn are selected from the group consisting of gallium (Ga), boron (B), aluminum (Al), and indium (In) in certain embodiments.

In some embodiments, the length of the stressor layer 101 in the Y direction ranges from about 5 nm to about 30 nm, and the thickness of the stressor layer 101 in the Z direction (height direction) ranges from about 20 nm to about 40 nm. In other embodiments, the length of the stressor layer 101 in the Y direction ranges from about 8 nm to about 10 nm.

The source/drain regions 102 include a heavily p$^+$ doped Ge or SiGe in some embodiments. The source/drain regions 102 contain a dopant at a concentration of greater than $10^{20}$ atoms cm$^{-3}$ in some embodiments. In certain embodiments, the dopants include gallium (Ga) and boron (B). In certain embodiments, the source/drain region is a p$^+$ region, and the source/drain region includes $Si_{1-x}Ge_x$, where $0 \leq x \leq 1$. The length of source/drain region 102 in the Y direction ranges from about 5 nm to about 30 nm, and the thickness of the source/drain region 102 in the Z direction (height direction) ranges from about 10 nm to about 80 nm in some embodiments. The thickness of channel region 103 in the Z direction ranges from about 10 nm to about 70 nm in some embodiments. In certain embodiments, the stressor layer 101 and the source/drain regions 102 are about the same thickness in the Z direction, the stressor layer 101 is thinner than the source/drain regions 102 in the Z direction, or the stressor layer 101 is thicker than the source/drain regions in the Z direction (see FIGS. 32-37). In certain embodiments, the source/drain regions 102 are wider along the A-A' direction of FIG. 1A than the channel region 103.

In certain embodiments, the channel region 103 of the fin includes lightly doped, n$^+$ doped (inversion mode FET), or p$^+$ doped (junctionless mode FET) Ge, SiGe, GeSn, or SiGeSn for the PFET.

FIGS. 2-12B show exemplary sequential processes for manufacturing a FinFET device according to embodiments of the present disclosure. It is understood that additional operations can be provided before, during, and after processes shown by FIGS. 2-12B, and some of the operations described below can be replaced or eliminated, for certain embodiments of the method. The order of the operations/processes may be interchangeable.

Figure 2:
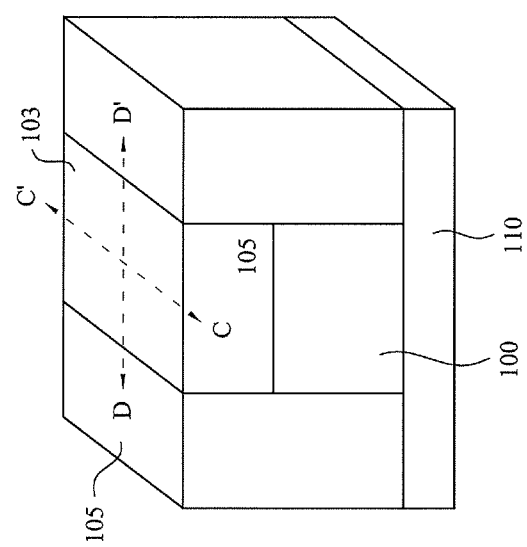
FIGS. 2-12B depict a method for manufacturing a semiconductor device according to an embodiment of the present disclosure.

As shown in FIG. 2, a strain relaxed buffer layer 100 is formed over a semiconductor substrate 110.

The semiconductor substrate 110 includes a single crystalline semiconductor layer on at least its surface portion. The substrate 110 may comprise a single crystalline semiconductor material such as, but not limited to Si, Ge, SiGe, GaAs, InSb, GaP, GaSb, InAlAs, InGaAs, GaSbP, GaAsSb, and InP. In some embodiments, the substrate 110 is a silicon-on-insulator substrate. In a certain embodiment, the substrate 110 is made of Si.

The strain relaxed buffer layer 100 serves to gradually change the lattice constant from that of the substrate to that of the source/drain regions. The buffer layer 100 may be formed from epitaxially grown single crystalline semiconductor materials such as, but not limited to Si, Ge, GeSn, SiGe, SiGeSn, GaAs, InSb, GaP, GaSb, InAlAs, InGaAs, GaSbP, GaAsSb, GaN, GaP, and InP. In a particular embodiment, a silicon germanium (SiGe) buffer layer is epitaxially grown on the silicon substrate 110.

In some embodiments, the strain relaxed buffer layer 100 includes $Si_{1-x-y}Ge_xSn_y$, where $0 \leq x \leq 1$, $0 \leq y \leq 0.3$, and $x+y \leq 1$. In certain embodiments, the germanium concentration of the SiGe buffer layer increases from 30 atomic % at the bottom of the buffer layer to 70 atomic % at the top of the buffer layer.

An insulating layer 105, such as shallow trench isolation layer is formed surrounding the strain relaxed buffer layer 100. The insulating material for the insulating layer 105 may include silicon oxide, silicon nitride, silicon oxynitride (SiON), SiOCN, fluorine-doped silicate glass (FSG), or a low-k dielectric material, formed by LPCVD (low pressure chemical vapor deposition), plasma-CVD, flowable CVD, or other suitable operation. An anneal operation may be performed after the formation of the insulating layer 105.

A channel region 103 is formed over the buffer layer 100. In some embodiments, the channel region 103 is formed by etching a portion of the buffer layer 100 to form an open space and then depositing channel region material into the space between the insulating layers 105. The channel region may be lightly doped, n$^+$ doped (inversion mode FET) or p$^+$ doped (junctionless mode FET) Ge, SiGe, GeSn, or SiGeSn formed by CVD, including LPCVD and PECVD, PVD, and ALD, or other suitable processes. The length of channel along the Y direction ranges between about 5 nm and about 30 nm in some embodiments.

Figure 3A:
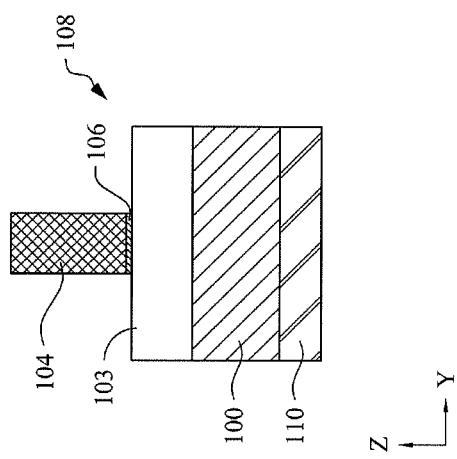
Figure 3B:
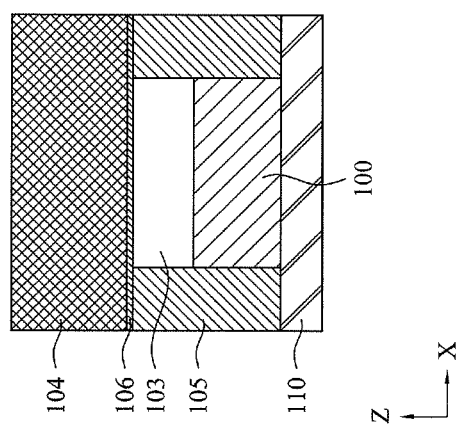

A dummy gate dielectric layer 106 and a dummy gate electrode 104 are subsequently formed over the channel region 103 and the insulating layer 105, as shown in FIG. 3A, corresponding to line D-D' in FIG. 2, and FIG. 3B, corresponding to line C-C' in FIG. 2A. The dummy gate electrode 104 may be formed by depositing a suitable gate electrode material, such as polysilicon, and patterning the deposited gate electrode material using photolithography and etching operations to provide the structure shown in FIGS. 3A and 3B.

Figure 5:
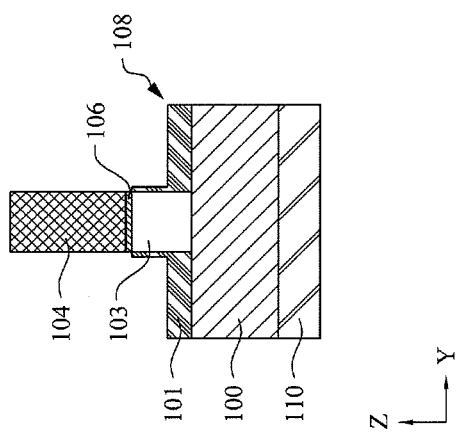
Figure 4:
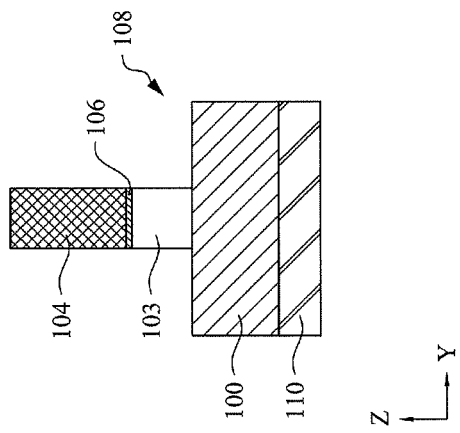

The channel region 103 is subsequently etched, as shown in FIG. 4, and a stressor layer material is deposited on the buffer layer 100 to form a stressor layer 101. The stressor layer material includes GeSn or SiGeSn, which may be undoped or doped with Ga, B, Al, or In at a concentration of less than $10^{19}$ atoms cm$^{-3}$ of the dopant. The stressor layer 101 may be deposited on the buffer layer 100 by CVD, including LPCVD and PECVD, PVD, and ALD, or other suitable processes. During the stressor layer deposition operation stressor layer material is also deposited on the sidewalls of the channel region 103, to form an L-shaped stressor layer 101, as shown in FIG. 5. The thickness of the L-shaped portion of the stressor layer 101 along the sidewall of the channel region in the Y-direction ranges between about 0 nm and about 5 nm in some embodiments.

In certain embodiments the stressor layer 101 includes $Si_{1-x-y}Ge_xSn_y$, and the channel region 103 includes $Si_{1-p-q}Ge_pSn_q$, where x and p range from 0 to 1, q ranges from 0 to 0.3, 0<y≤0.3, x+y≤1, and q+p≤1. The stressor layer 101 and the channel region 103 are formed with different compositions. The lattice constant along the Z direction of the stressor layer 101 compositions is larger than that of channel region 103 in certain embodiments.

Figure 7:
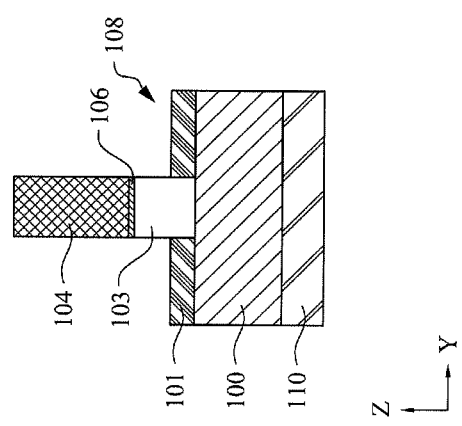
Figure 6:
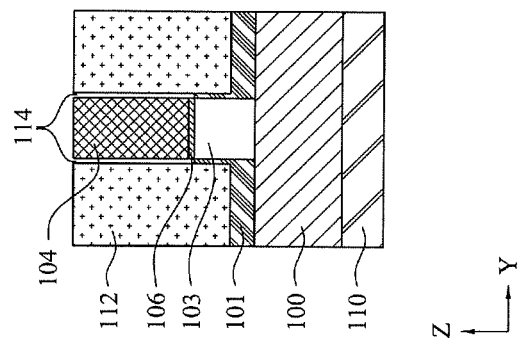

A mask material is subsequently deposited on the stressor layer 101 to form a first mask 112. The first mask 112 can be formed of a photoresist, and insulating material, or a metal. The first mask is patterned by photolithography and etching operations to form openings 114 to expose the portion of the stressor layer 101 formed on the sidewalls of the channel region 103, as shown in FIG. 6. The portion of the stressor layer 101 formed on the sidewalls of the channel region is subsequently removed by a suitable etching operation to planarize the stressor layer 101 and the first mask 112 is removed, as shown in FIG. 7.

Figure 8:
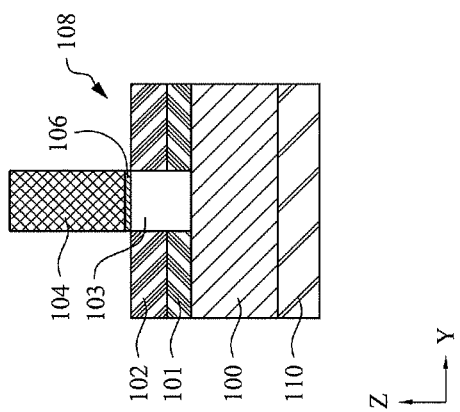

Source/drain regions 102 are subsequently formed on the stressor layer 101, as shown in FIG. 8. In this disclosure, a source and a drain are interchangeably used and the structures thereof are substantially the same. The source/drain regions 102 include heavily doped regions of Ge or SiGe containing a dopant at a concentration of greater than $10^{20}$ atoms $cm^{-3}$ in certain embodiments. The source/drain regions 102 are formed by epitaxy in some embodiments.

Figure 9:
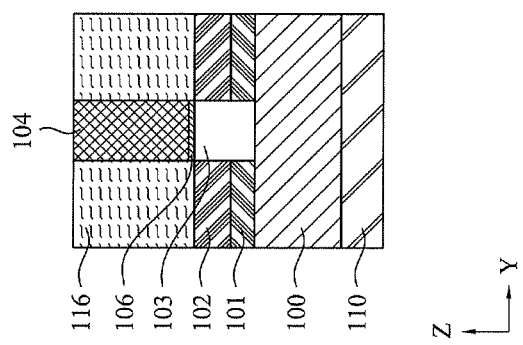
Figure 10B:
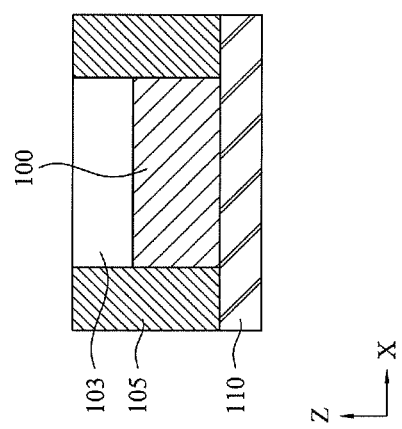
Figure 10A:
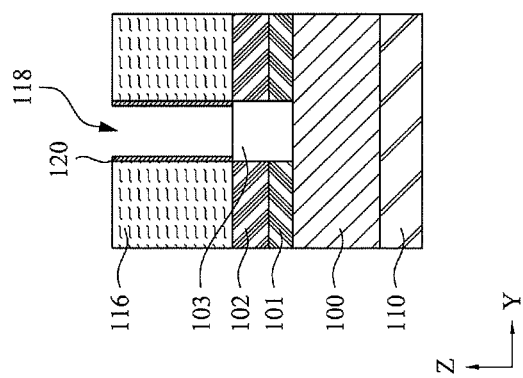

As shown in FIG. 9, a second mask 116 is subsequently formed over the source/drain regions 102. Chemical-mechanical polishing (CMP) is used to planarize the second mask 116 and expose the surface of the dummy gate electrode 104. The dummy gate electrode 104 and dummy gate dielectric layer 106 are subsequently removed by etching operations to form a gate space 118, and an inner spacer layer 120 is formed on the sidewalls of the gate space, as shown in FIG. 10A, corresponding to line C-C' in FIG. 2, and FIG. 10B, corresponding to line D-D' in FIG. 2. The inner spacer layer 120 is formed of an oxide or a nitride, such as silicon oxide or silicon nitride, in certain embodiments. In some embodiments, the inner spacer layer 120 is formed by conformally deposited by CVD or ALD. The inner spacer layer 120 laterally extending on the channel region 103 is removed by anisotropic etching leaving the inner spacer layer 120 remaining along the sidewalls of the gate space 118. The thickness of the inner spacer layer 120 along the sidewalls of the gate space 118 ranges between about 1 nm and about 15 nm in some embodiments.

Figure 11B:
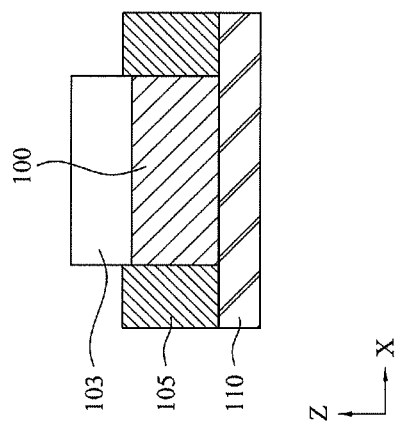
Figure 11A:
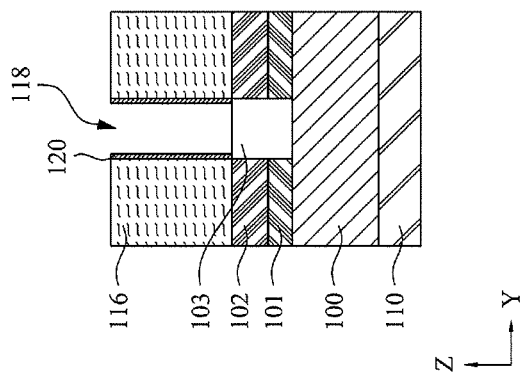

The insulating layer 105 is recess etched by selective etching to expose a portion of the channel region 103, as shown in FIGS. 11A and 11B, corresponding to lines C-C' and D-D' in FIG. 2, respectively. In some embodiments, the overlap between the recessed etch insulating layer 105 and the channel region ranges from 0 nm to about 40 nm. Adverting to FIGS. 12A and 12B, a gate electrode structure 122 is formed over the exposed channel region 103 and the insulating layer 105. The gate electrode structure 122 includes a gate electrode 146 and a gate dielectric layer 148 between the gate electrode 146 and the channel region 103. The inner spacer layer 120 forms insulating gate sidewalls on opposing lateral surfaces of the gate electrode structure 122. After forming the gate electrode structure 122 the second mask 116 is removed by an etching operation.

In some embodiments, the gate electrode structure 122 includes a high-k gate dielectric layer 148 and a metal gate electrode 146 (HK/MG). According to embodiments of the disclosure, the high-k gate dielectric layer 148 includes one or more layers of $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. The metal gate electrode 146 includes one or more layers of Ti, TiN, titanium-aluminum alloy, Al, AlN, Ta, TaN, TaC, TaCN, and TaSi.

Figure 14:
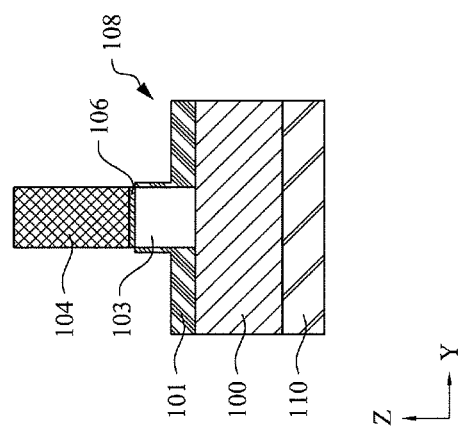
FIGS. 13-19B depict a method for manufacturing a semiconductor device according to an embodiment of the present disclosure.
Figure 13:
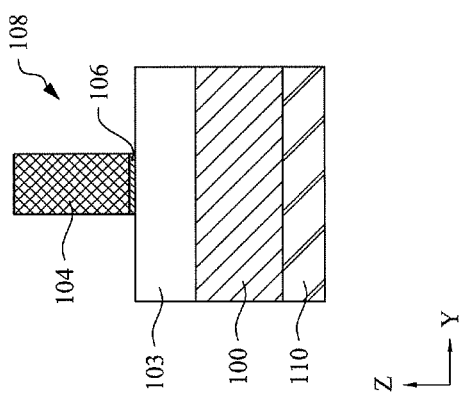

In another embodiment of the present disclosure, a FinFET with an L-shaped stressor layer 101 is formed, as illustrated in FIGS. 13-19B. A dummy gate dielectric layer 106 and dummy gate electrode 104 are formed over a fin 108 including a channel region 103 and strain relaxed buffer layer 100 formed on a semiconductor substrate 110, as shown in FIG. 13. The structure is formed using the same operations disclosed in reference to FIGS. 3A and 3B. The channel region is etched, and a stressor layer 101 is formed over the buffer layer 100 and along the sidewalls of the channel region 103 in the same manner as described with reference to FIGS. 4 and 5, to form an L-shaped stressor layer 101, as shown in FIG. 14.

Figure 15:
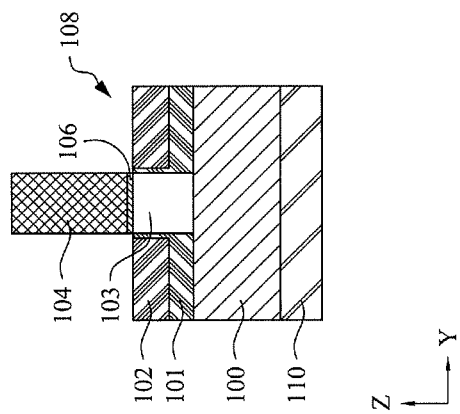

Source/drain regions 102 are subsequently formed on the stressor layer 101, as shown in FIG. 15 in the same manner as disclosed in reference to FIG. 8.

Figure 16:
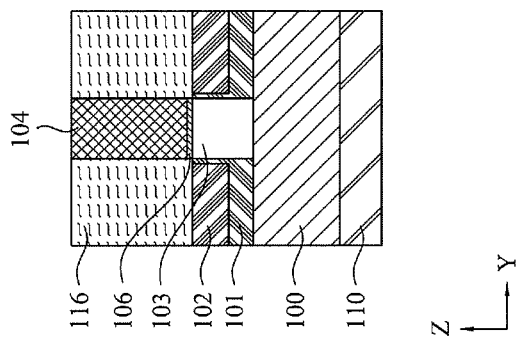
Figure 17B:
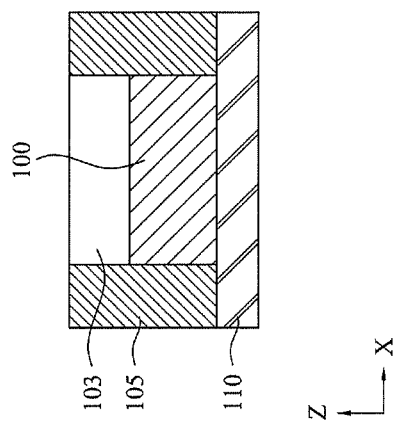
Figure 17A:
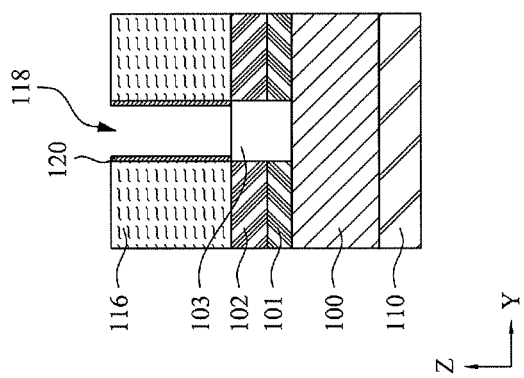

As shown in FIG. 16, a mask 116 is subsequently formed over the source/drain regions 102. The mask 116 can be formed of a photoresist, and insulating material, or a metal. Chemical-mechanical polishing (CMP) is used to planarize the mask 116 and expose the surface of the dummy gate electrode 104. The dummy gate electrode 104 and dummy gate dielectric layer 106 are subsequently removed by etching operations to form a gate space 118, and an inner spacer layer is formed on the sidewalls of the gate space, as shown in FIG. 17A, corresponding to line C-C', and FIG. 17B, corresponding to line D-D' of FIG. 2, respectively.

Figure 18B:
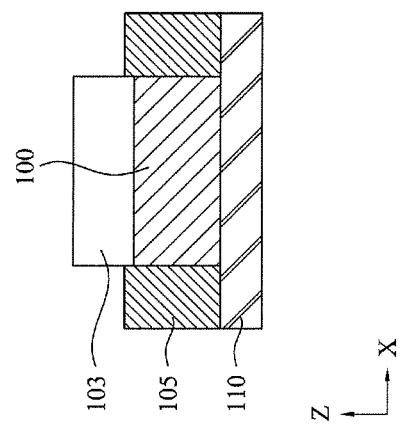
Figure 18A:
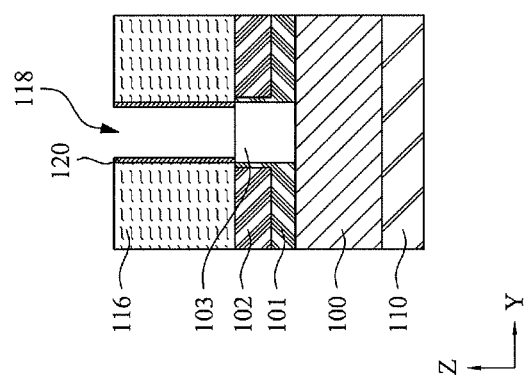
Figure 19B:
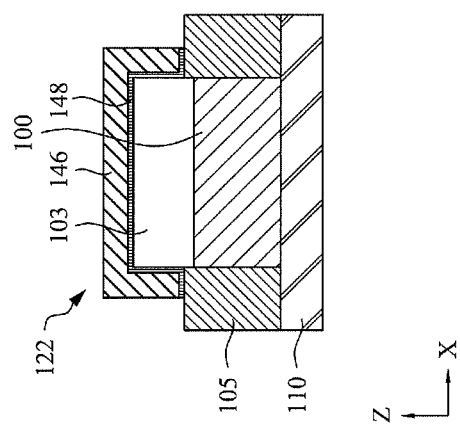
Figure 19A:
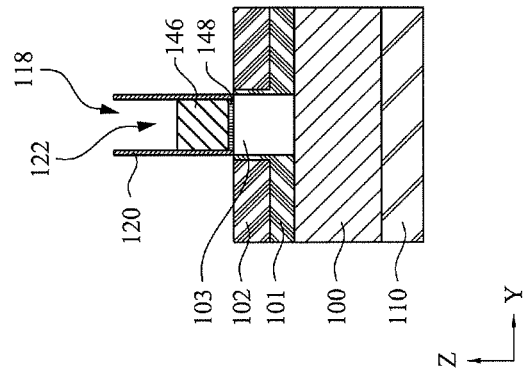

The insulating layer 105 is recess etched to expose a portion of the channel region 103, as shown in FIGS. 18A and 18B, corresponding to lines C-C' and D-D' of FIG. 2, respectively. Adverting to FIGS. 19A and 19B, a HK/MG gate electrode structure 122 is formed over the exposed channel region 103 and the insulating layer 105.

Figure 20:
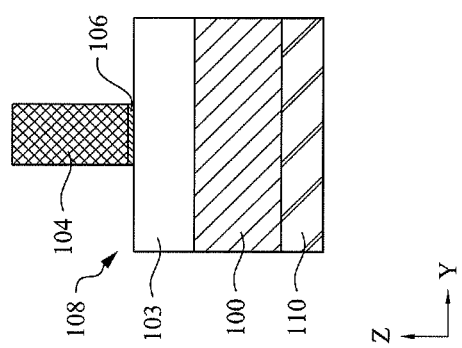
FIGS. 20-30 depict a method for manufacturing a semiconductor device according to an embodiment of the present disclosure.

In another embodiment of the present disclosure a FinFET is formed, as illustrated in FIGS. 20-31. A dummy gate dielectric layer 106 and dummy gate electrode 104 are formed over a fin 108 including a channel region 103 and strain relaxed buffer layer 100 formed on a semiconductor substrate 110, as shown in FIG. 20. The structure is formed using the same operations disclosed in reference to FIGS. 3A, 3B, and 13.

Figure 21B:
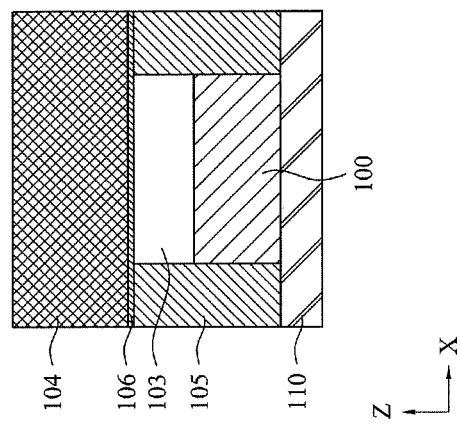
Figure 21A:
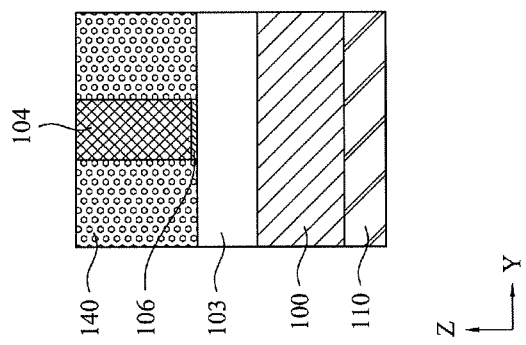

As shown in FIGS. 21A and 21B, a first mask 140 is formed over the channel region layer 103. Chemical-mechanical polishing (CMP) is used to planarize the first mask 140 and expose the surface of the dummy gate electrode 104. FIG. 21A corresponds to line C-C' of FIG. 2 and FIG. 21B corresponds to line D-D' of FIG. 2.

Figure 22B:
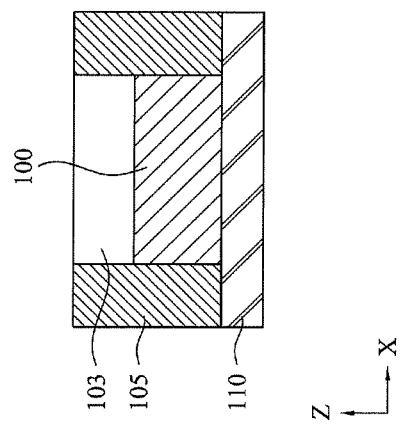
Figure 22A:
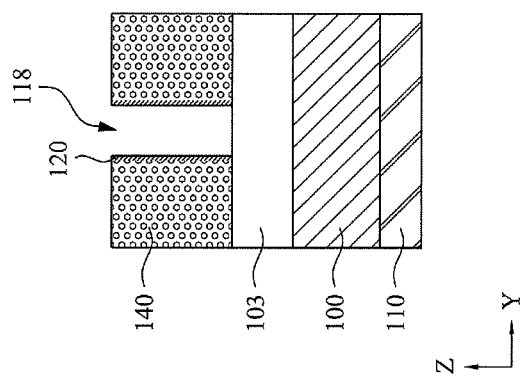

The dummy gate electrode 104 and dummy gate dielectric layer 106 are subsequently removed by etching operations to form a gate space 118, and an inner spacer layer 120 is formed on the sidewalls of the gate space, as shown in FIG. 22A, corresponding to line C-C' of FIG. 2, and FIG. 22B, corresponding to line D-D' of FIG. 2.

Figure 23B:
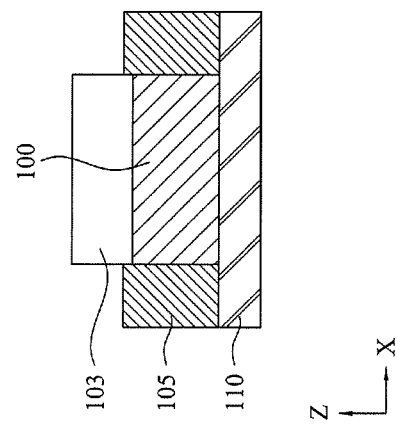
Figure 23A:
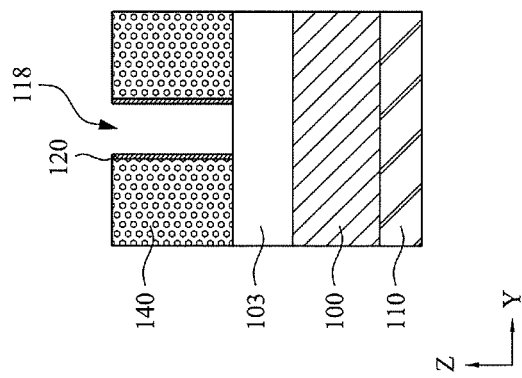
Figure 24B:
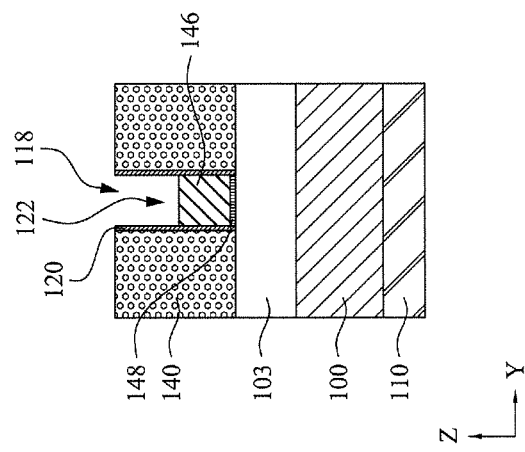
Figure 24A:
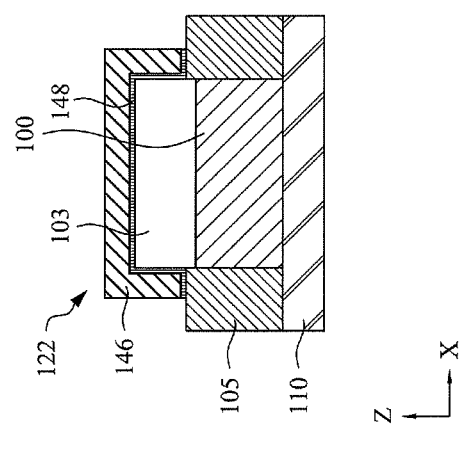

The insulating layer 105 is recess etched to expose a portion of the channel region 103, as shown in FIGS. 23A and 23B, corresponding to lines C-C' and D-D' of FIG. 2, respectively. Adverting to FIGS. 24A and 24B, a HK/MG gate electrode structure 122 is formed over the exposed channel region 103 and the insulating layer 105.

Figure 25B:
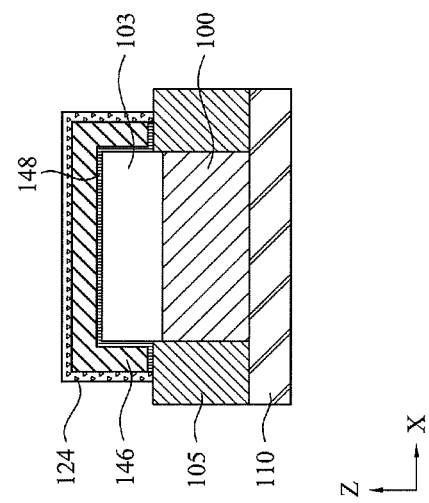
Figure 25A:
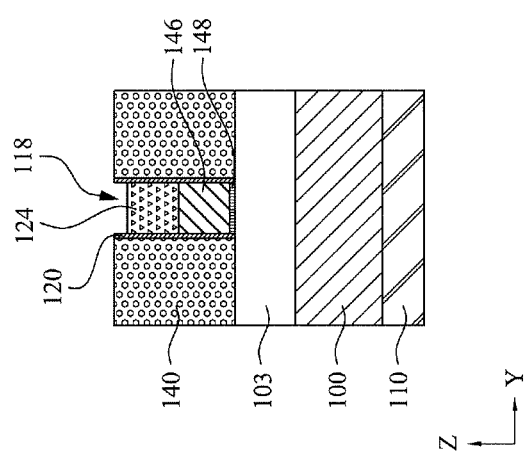
Figure 26:
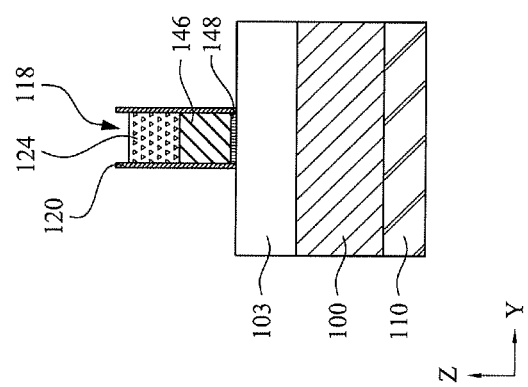

A passivation layer 124 is subsequently formed over the gate electrode structure 122, as shown in FIGS. 25A and 25B, corresponding to lines C-C' and D-D', respectively. In certain embodiments, the passivation layer 124 is a metal oxide layer having a thickness of at least 5 nm up to the height the inner spacer layer 120. The metal oxide layer can be formed by CVD, PVD, and ALD, or other suitable processes. The first mask 140 is subsequently removed using an etching operation, as shown in FIG. 26.

Figure 27:
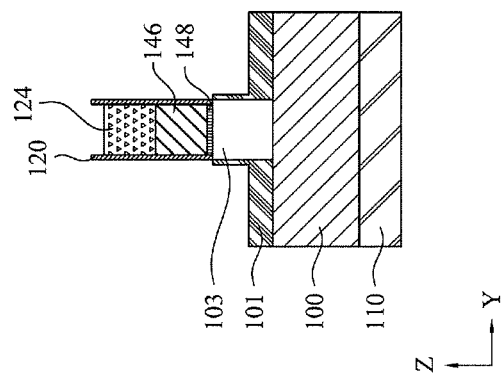

As shown in FIG. 27, the channel region 103 is subsequently etched using the passivation layer 124 and inner spacer layer 120 as a mask, and a stressor layer material is deposited on the buffer layer 100 to form a stressor layer 101, in the same manner as referenced to in FIGS. 4 and 5, to form an L-shaped stressor layer 101.

Figure 28:
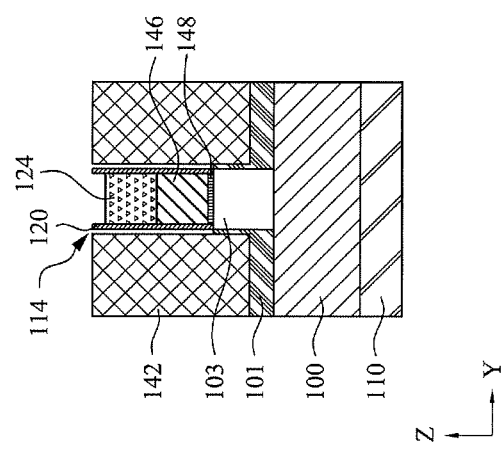
Figure 29:
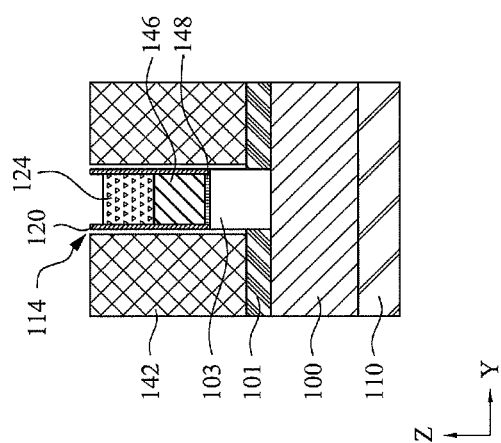

A mask material is subsequently deposited on the stressor layer 101 to form a second mask 142. The second mask is patterned by photolithography and etching operations to form openings 114 to expose the portion of the portion of the stressor layer 101 formed on the sidewalls of the channel region 103, as shown in FIG. 28. The portion of the stressor layer 101 formed on the sidewalls of the channel region 103 is subsequently removed by a suitable etching operation, as shown in FIG. 29, to planarize the stressor layer 101.

Figure 30:
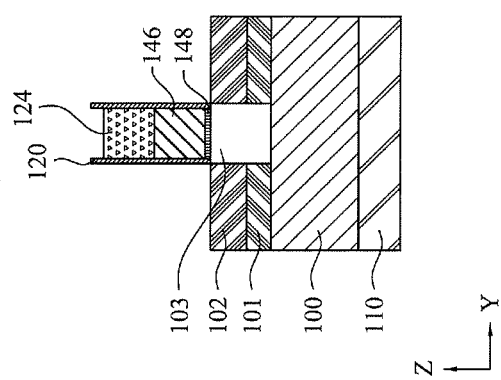

The second mask 142 is removed, and source/drain regions 102 are subsequently formed on the stressor layer 101, as shown in FIG. 30, in the same manner as disclosed with reference to FIGS. 6-8.

Figure 31:
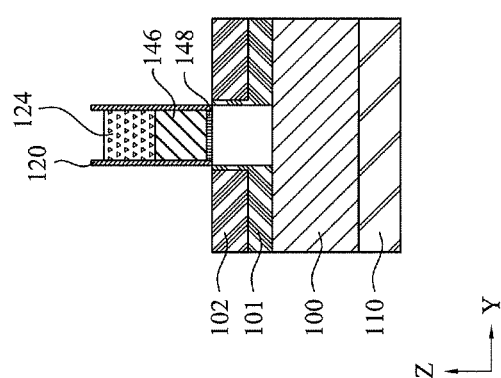
FIG. 31 depicts a semiconductor device according to an embodiment of the present disclosure.

In another embodiment, a FinFET is formed having an L-shaped stressor layer 101, as shown in FIG. 31. In this embodiment, the FinFET is formed by the operations disclosed in reference to FIGS. 20-27 followed by forming source/drain regions 102 in the same manner as disclosed in reference to FIGS. 8 and 15.

Various embodiments of the present disclosure are illustrated in FIGS. 32-37. FIGS. 32-37 are side views of the FinFETs. Although, the gate electrodes 104 appear to be immediately adjacent to the source/drain regions 102 in these side views, the gate electrodes 104 and source/drain regions 102 do not contact each other. The gate electrodes 104 overlie the channel regions 103 in these figures.

Figure 32:
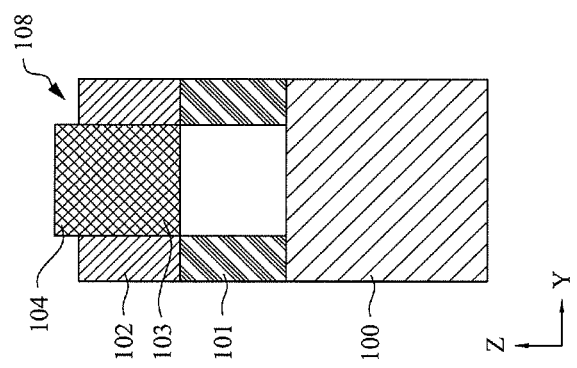
FIG. 32 depicts a semiconductor device according to an embodiment of the present disclosure.

FIG. 32 illustrates a FinFET where the stressor layer 101 is located above the strain relaxed buffer layer 100, and the source/drain regions 102 are located above the stressor layer 101.

Figure 33:
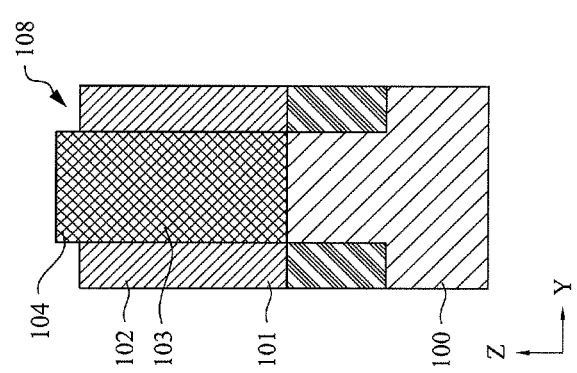
FIG. 33 depicts a semiconductor device according to an embodiment of the present disclosure.

In the embodiment of FIG. 33, the stressor layer 101 is embedded in the strain relaxed buffer layer 100, and the lower surface of the source/drain regions 102 are substantially coplanar with the upper surface of the strain relaxed buffer layer 100.

Figure 34:
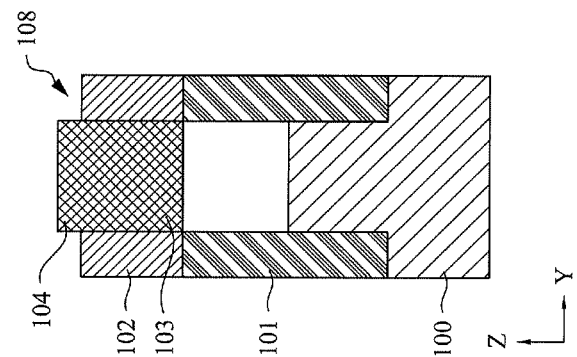
FIG. 34 depicts a semiconductor device according to an embodiment of the present disclosure.

The embodiment of FIG. 34 is a combination of the embodiments of FIGS. 32 and 33, in which the stressor layer 101 is partially embedded in the strain relaxed buffer layer 100 and a portion of the stressor layer 101 extends above the upper surface of the strain relaxed buffer layer 100. The source/drain regions 102 are located above the stressor layer 101.

Figure 35:
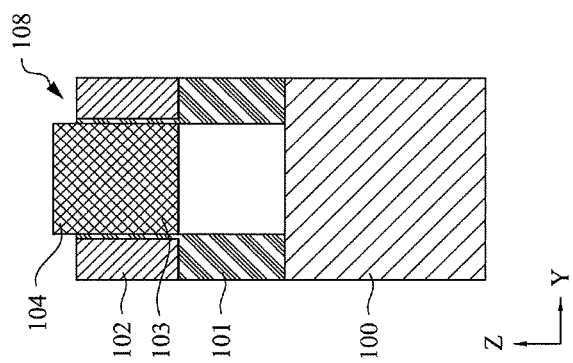
FIG. 35 depicts a semiconductor device according to an embodiment of the present disclosure.
Figure 36:
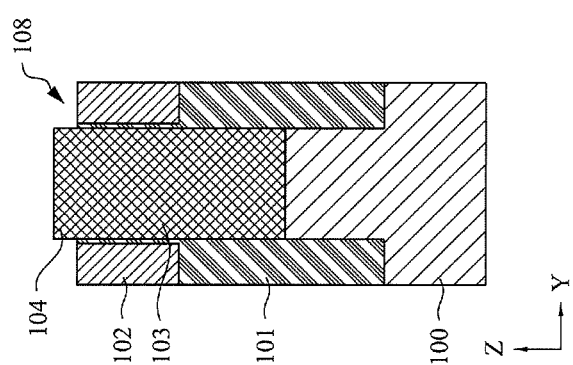
FIG. 36 depicts a semiconductor device according to an embodiment of the present disclosure.
Figure 37:
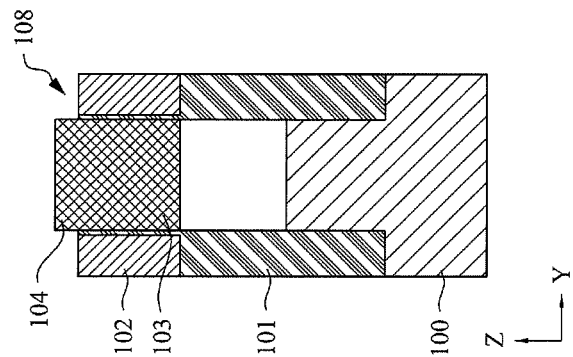
FIG. 37 depicts a semiconductor device according to an embodiment of the present disclosure.

The embodiments of FIGS. 35-37 correspond to the embodiments of FIGS. 32-34, respectively, with the difference being that the stressor layers 100 are L-shaped. In FIG. 35, the stressor layer 101 is located above the strain relaxed buffer layer 100. In FIG. 36, a full width portion of the stressor layer 101 is embedded in the strain relaxed buffer layer 100, and an L-shaped portion of stressor layer 101 extends along sidewall of channel region 103, which is located under the gate electrode 104. In FIG. 37, the full width portion of the stressor layer 101 is partially embedded in the strain relaxed buffer layer 100 and extends above the upper surface of the relaxed buffer layer 100, and the L-shaped portion extends along portions of the sidewalls of the channel region 103 covered by the gate electrode 104.

Figure 38C:
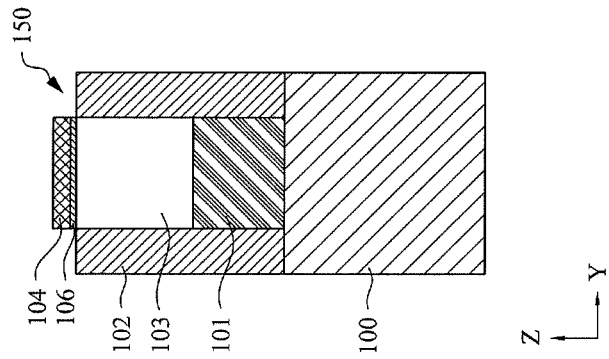
FIGS. 38A-38C depict a semiconductor device according to an embodiment of the present disclosure.
Figure 38B:
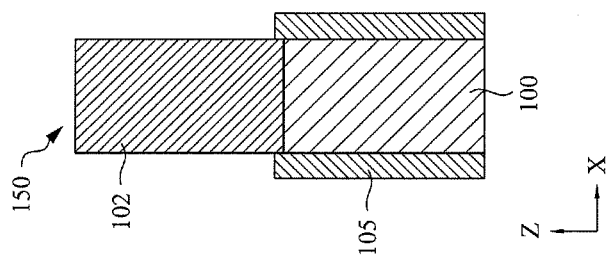
Figure 38A:
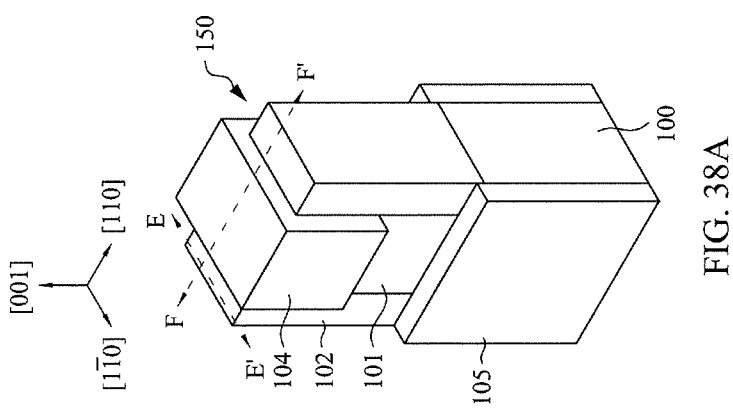

Another embodiment of the present disclosure is depicted in FIGS. 38A-38C, illustrating an N-type FinFET including a fin 150 where the stressor layer 101 is located between the strain relaxed buffer layer 100 and the fin channel regions 103 to increase tensile strain in the channel region thereby enhancing electron mobility. FIG. 38A is an isometric view of the N-FinFET, FIG. 38B is a cross section corresponding to line E-E' of FIG. 38A, and FIG. 38C is a cross section corresponding to line F-F' of FIG. 38A.

FIGS. 39-46B show exemplary sequential processes for manufacturing a FinFET device according to embodiments of the present disclosure. It is understood that additional operations can be provided before, during, and after processes shown by FIGS. 39-46B, and some of the operations described below can be replaced or eliminated, for certain embodiments of the method. The order of the operations/processes may be interchangeable.

Figure 39:
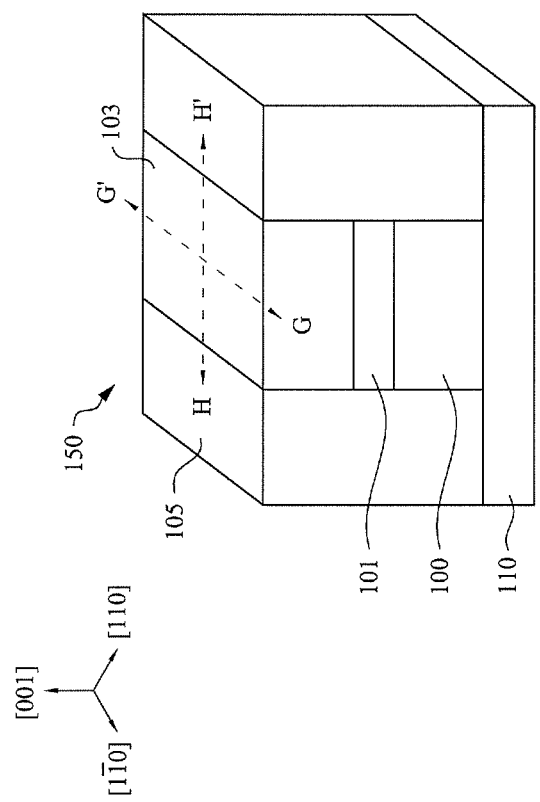

As shown in FIG. 39, a strain relaxed buffer layer 100 is formed over a semiconductor substrate 110. The semiconductor substrate 110 includes a single crystalline semiconductor layer on at least its surface portion. The semiconductor substrate 110 can be any of the materials disclosed in reference to FIG. 2. The strain relaxed buffer layer 100 serves to gradually change the lattice constant from that of the substrate to that of the channel region. The buffer layer 100 may be formed from epitaxially grown single crystalline semiconductor materials such as those disclosed in reference to FIG. 2. A stressor layer 101 is formed over the strain relaxed buffer layer and a channel region 103 is formed over the stressor layer 101. An insulating layer 105, such as shallow trench isolation layer, is formed surrounding the strain relaxed buffer layer 100 and the stressor layer 101.

In some embodiments, the stressor layer 101 and channel region 103 are formed by etching a portion of the buffer layer 100 to form an open space and then depositing stressor layer material and channel region material into the space between the insulating layers 105. In certain embodiments, the stressor layer 101 includes GeSn or SiGeSn. In some embodiments, the stressor layer 101 includes GeSn or SiGeSn containing less than $10^{19}$ atoms cm$^{-3}$ of a dopant. In other embodiments, the stressor layer 101 includes GeSn or SiGeSn containing less than $10^{18}$ atoms cm$^{-3}$ of the dopant. The stressor layer 101 includes undoped GeSn or undoped SiGeSn in other embodiments. The channel region 103 of the fin includes lightly doped, p+ doped (inversion mode FET), or n+ doped (junctionless mode FET) Ge, SiGe, GeSn, or SiGeSn for the NFET. The stressor layer material includes GeSn or SiGeSn, which may be undoped, doped with an n+ dopant or p+ dopant. N-type dopants include P, As, or Sb and P-type dopants include B, Al, Ga, or In. The channel region 103 and the stressor layer 101 may be formed by CVD, including LPCVD and PECVD, PVD, and ALD, or other suitable processes.

Figure 40B:
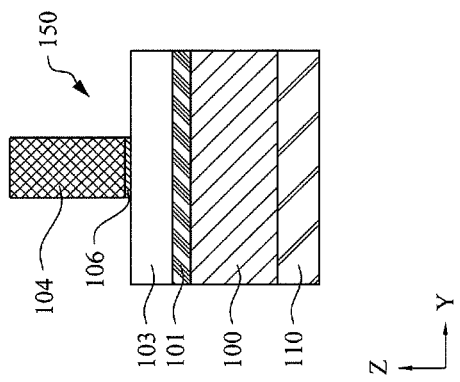
Figure 40A:
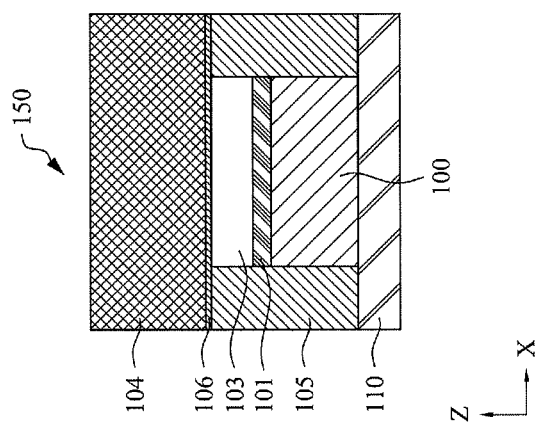

A dummy gate dielectric layer 106 and dummy gate electrode 104 are subsequently formed over the channel region 103 and the insulating layer 105, as shown in FIG. 40A, corresponding to line H-H' in FIG. 39, and FIG. 40B, corresponding to line G-G' in FIG. 39. The dummy gate electrode 104 may be formed by depositing a suitable gate electrode material, such as polysilicon, and patterning the deposited gate electrode material using photolithography and etching operations to provide the structure shown in FIGS. 40A and 40B.

Figure 42:
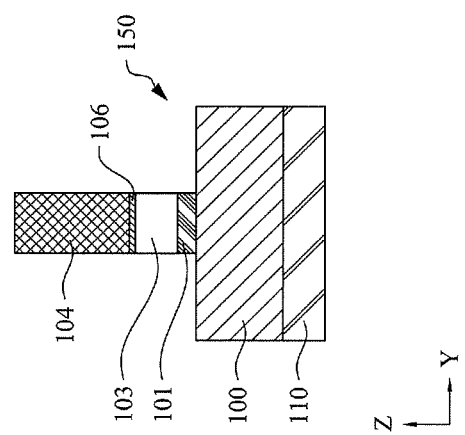
Figure 41:
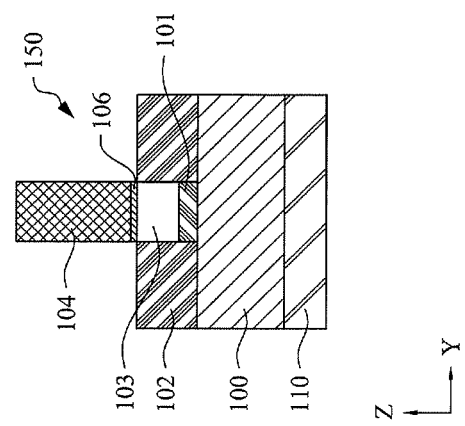

The channel region 103 and stressor layer 101 are subsequently etched, as shown in FIG. 41, to expose the strain relaxed buffer layer 100. Source/drain regions 102 are subsequently formed on the stressor layer 100, as shown in FIG. 42. The source/drain regions 102 include heavily doped regions of Ge or SiGe containing a dopant at a concentration of greater than $10^{20}$ atoms $cm^{-3}$ in certain embodiments. In certain embodiments, the source/drain region is an $n^+$ region, and the source drain region includes $Si_{1-x}Ge_x$, where $0 \le x \le 1$. The dopant may be P, As, or Sb. The source/drain regions 102 are formed by epitaxy in some embodiments.

Figure 43:
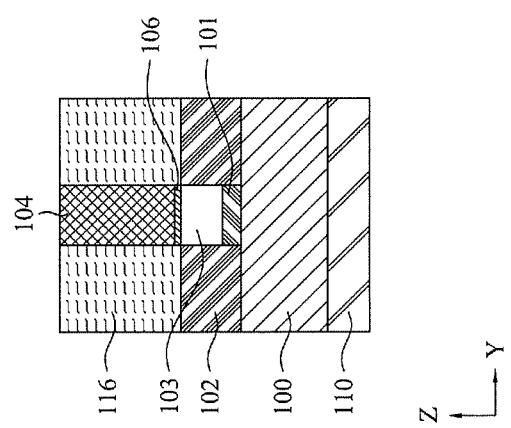

A mask material is subsequently deposited on the source/drain regions 102 to form a mask 116, as shown in FIG. 43. Chemical-mechanical polishing (CMP) is used to planarize the mask 116 and expose the surface of the dummy gate electrode 104. The dummy gate dielectric layer 106 and dummy gate electrode 104 are subsequently removed by etching operations to form a gate space 118, and an inner spacer layer 120 is formed on the sidewalls of the gate space, as shown in FIG. 44A, corresponding to line G-G', and FIG. 44B, corresponding to line H-H' of FIG. 39, respectively. The inner spacer layer is formed of an oxide or nitride, such as silicon oxide or silicon nitride, respectively.

Figure 45B:
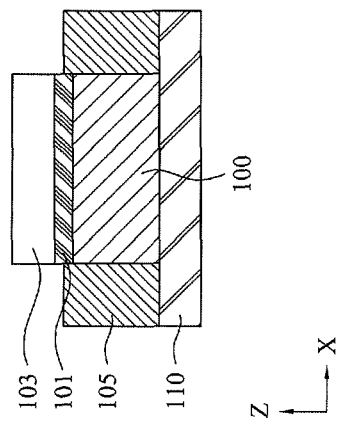
Figure 45A:
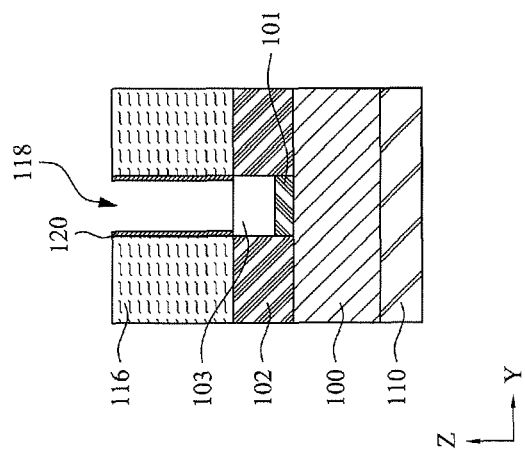

The insulating layer 105 is recess etched to expose a portion of the channel region 103, as shown in FIGS. 45A and 45B, corresponding to lines G-G' and H-H' of FIG. 39, respectively. Adverting to FIGS. 46A and 46B, a gate electrode structure 122 is formed over the exposed channel region 103 and the insulating layer 105. The gate electrode structure 122 includes a gate electrode 146 and a gate dielectric layer 148 between the gate electrode and the channel region 103. After forming the gate electrode structure 122 the mask 116 is removed by an etching operation.

In some embodiments, the gate structure 122 includes a high-k gate dielectric layer 148 and a metal gate electrode 146 (HK/MG). According to embodiments of the disclosure, the high-k gate dielectric layer 148 includes one or more layers of $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. The metal gate electrode 146 includes one or more layers of Ti, TiN, titanium-aluminum alloy, Al, AlN, Ta, TaN, TaC, TaCN, and TaSi.

Figure 47:
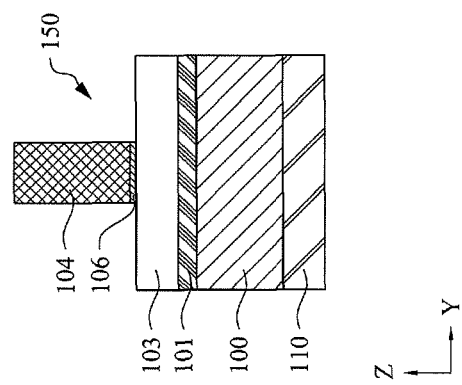

In another embodiment of the present disclosure a FinFET is formed, as illustrated in FIGS. 47-55. A dummy gate dielectric layer 106 and dummy gate electrode 104 are formed over a fin 150 including a channel region 103 and a stressor layer 101 formed over a strain relaxed buffer layer 100 formed on a semiconductor substrate 110, as shown in FIG. 47. The structure is formed using the same operations disclosed in reference to FIGS. 3A, 3B, and 13.

Figure 48:
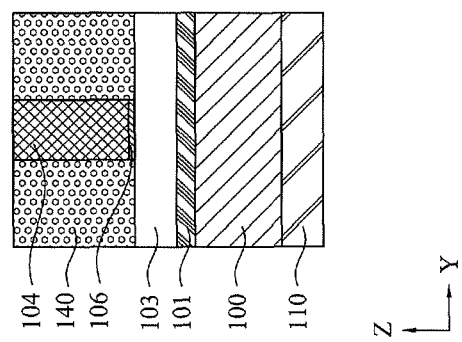
FIGS. 47-55 depict a method for manufacturing a semiconductor device according to an embodiment of the present disclosure.
Figure 49B:
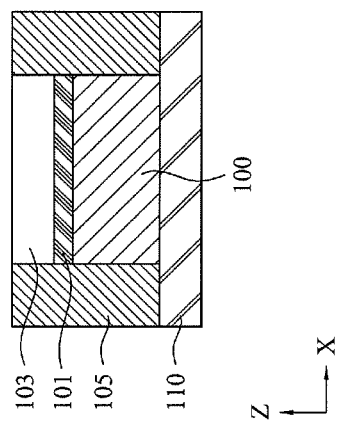
Figure 49A:
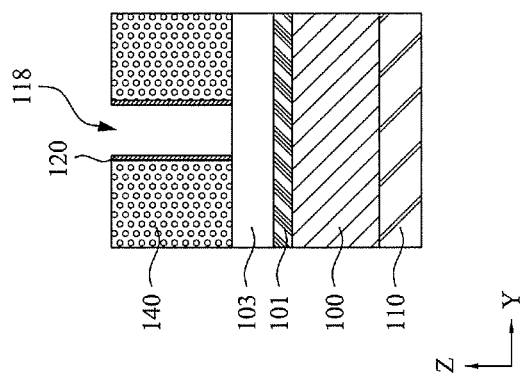

As shown in FIG. 48, a mask 140 is formed over the channel region layer 103. Chemical-mechanical polishing (CMP) is used to planarize the mask 140 and expose the surface of the dummy gate electrode 104. The dummy gate electrode 104 is subsequently removed by an etching operation to form a gate space 118, and an inner spacer layer 120 is formed on the sidewalls of the gate space, as shown in FIGS. 49A and 49B. FIG. 49A corresponds to line G-G' of FIG. 39 and FIG. 49B corresponds to line H-H' of FIG. 39.

Figure 50B:
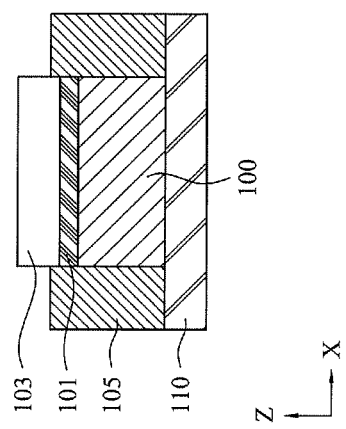
Figure 50A:
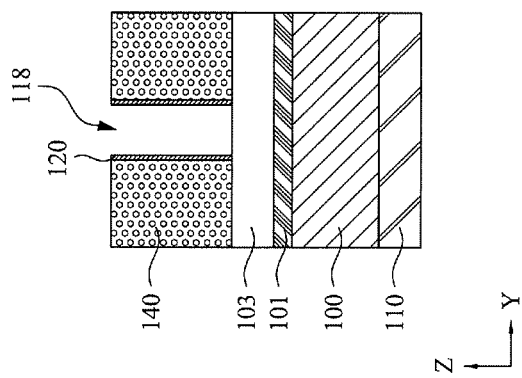
Figure 51B:
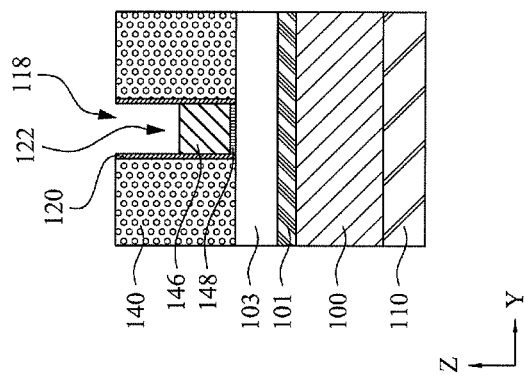
Figure 51A:
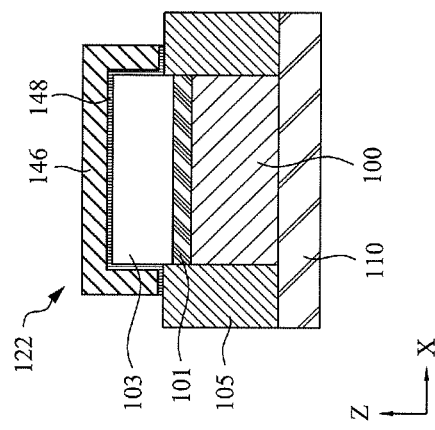

The insulating layer 105 is recess etched to expose a portion of the channel region 103, as shown in FIGS. 50A and 50B, corresponding to lines H-H' and G-G' of FIG. 39, respectively. Adverting to FIGS. 51A and 51B, a HK/MG gate electrode structure 122 is formed over the exposed channel region 103 and the insulating layer 105. The gate electrode structure 122 includes a gate electrode 146 and a gate dielectric layer 148 between the gate electrode and the channel region 103 in some embodiments.

Figure 52A:
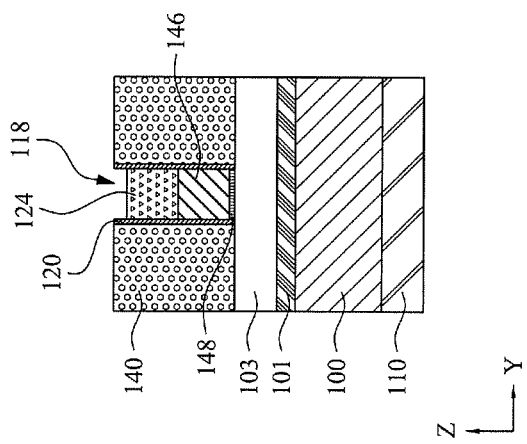
Figure 52B:
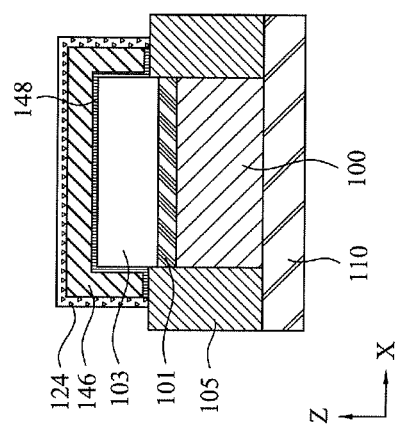
Figure 53:
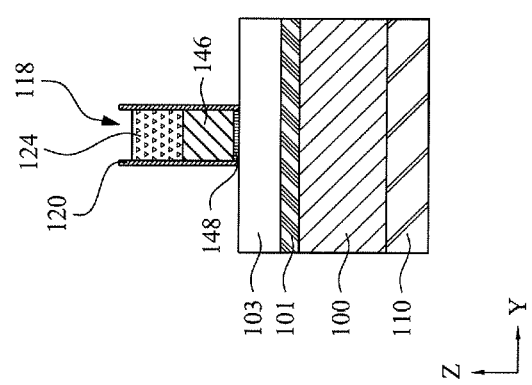

A passivation layer 124 is subsequently formed over the gate electrode structure 122, as shown in FIGS. 52A and 52B, corresponding to lines G-G' and H-H' of FIG. 39, respectively. In certain embodiments, the passivation layer 124 is a metal oxide layer. The metal oxide layer can be formed by CVD, including LPCVD and PECVD, PVD, and ALD, or other suitable processes. The mask 140 is subsequently removed using an etching operation, as shown in FIG. 53.

Figure 55:
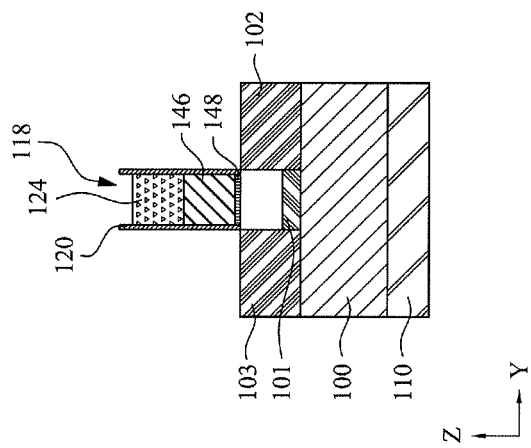
Figure 54:
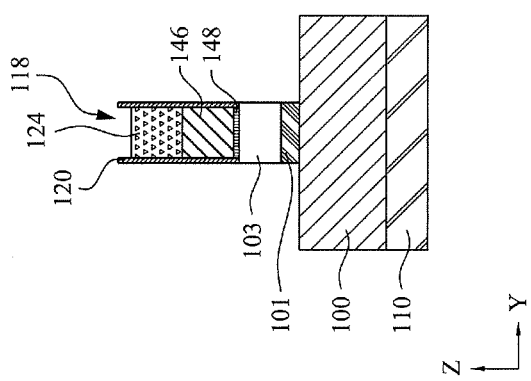

As shown in FIG. 54, the channel region 103 and stressor layer 101 are subsequently etched, to expose the strain relaxed buffer layer 100. Source/drain regions 102 are subsequently formed on the strain relaxed buffer layer 100, as shown in FIG. 55. The source/drain regions 102 include heavily doped regions of Ge or SiGe containing a dopant at a concentration of greater than $10^{20}$ atoms $cm^{-3}$ in certain embodiments. The dopant may be P, As, or Sb. The source/drain regions 102 are formed by epitaxy in some embodiments.

Figure 56B:
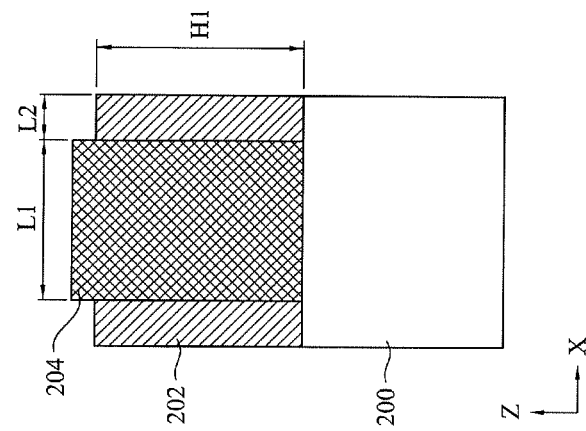
FIG. 56B depicts a semiconductor device without a stressor layer.
Figure 56A:
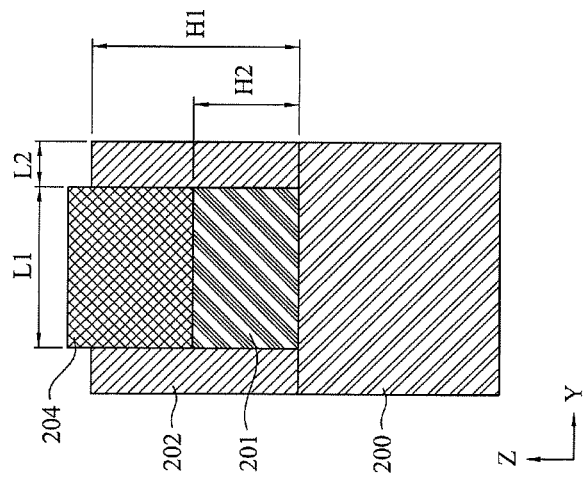
FIG. 56A depicts a semiconductor device having a stressor layer.
Figure 56C:
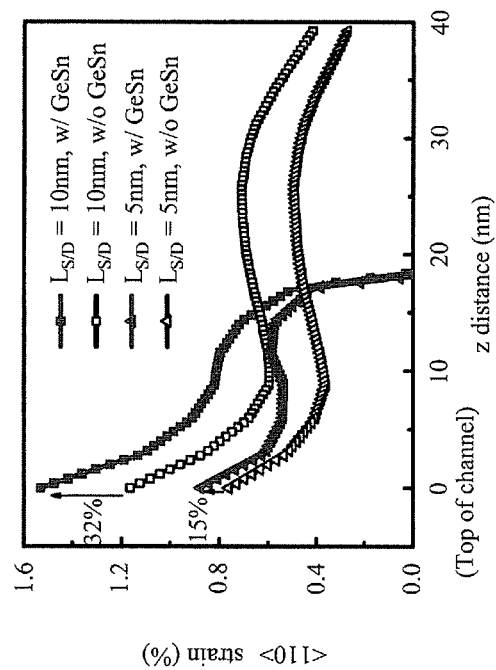
FIG. 56C compares the strain in the channel of the semiconductor devices with and without stressor layers.

The strain in the channel of embodiments of the present disclosure are contrasted with comparative examples not having a stressor layer in FIGS. 56A-56C. As shown in FIG. 56A, an exemplary stressor layer 201 including $Ge_{0.9}Sn_{0.1}$ is formed between a channel region comprising Ge and a strain relaxed buffer layer 200 including Ge. The channel region is covered by the gate electrode structure 204 in FIGS. 56A and 56B. $N^+$ source/drain regions 202 are located alongside the channel region above the strain relaxed buffer layer 200. In this example, the height H1 of the source/drain regions is 40 nm, the channel length L1 is 20 nm. The height H2 of the stressor layer is 20 nm. The comparative FinFET of FIG. 56B is the same as the FinFET of FIG. 56A, except it does not include a stressor layer, rather the channel region, which is covered by the gate electrode structure 204, has the same 40 nm height H1 as the source/drain regions 202. Although, the gate electrode structures 204 appear to be immediately adjacent to the source/drain regions 202 in these side views, the gate electrode structures 204 and source/drain regions 202 do not contact each other.

The [110] strain in the channel region is contrasted in FIG. 56C for two different source/drain region lengths L2, 5 nm and 10 nm. As shown in FIG. 56C, for a source/drain having a 10 nm length the FinFET with the GeSn stressor layer 201 has a 32% greater [110] channel strain at the top of the channel than the FinFET without a GeSn stressor layer. When the source/drain region length L2 is 5 nm, the FinFET with the GeSn stressor layer has a 15% greater [110] channel strain at the top of the channel than the FinFET without the GeSn stressor layer. As shown in FIGS. 1A and 38A, the [110] channel direction strain corresponds to lines B-B' and F-F' in FIG. 1A and FIG. 38 A, respectively.

Figure 57A:
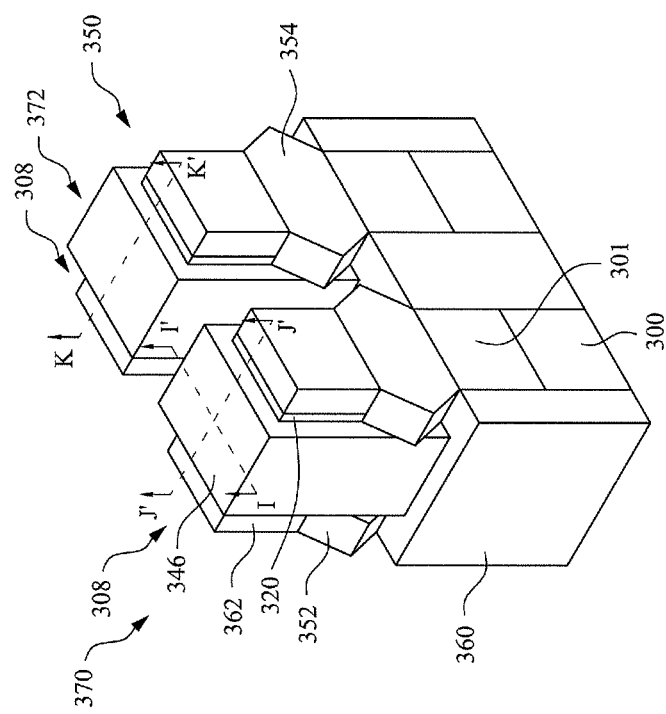
FIG. 57A-57D depict a semiconductor device according to an embodiment of the present disclosure.
Figure 57B:
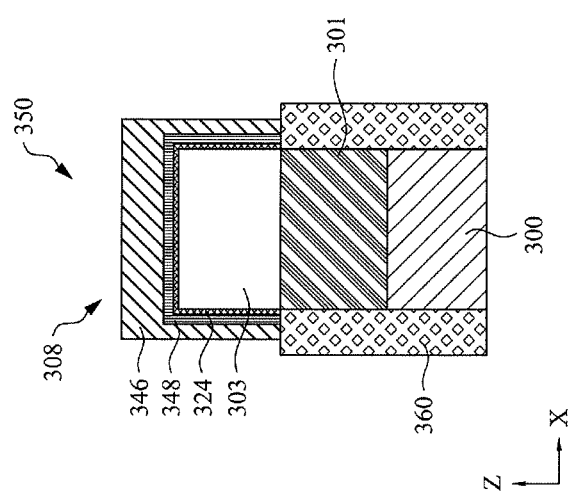
Figure 57D:
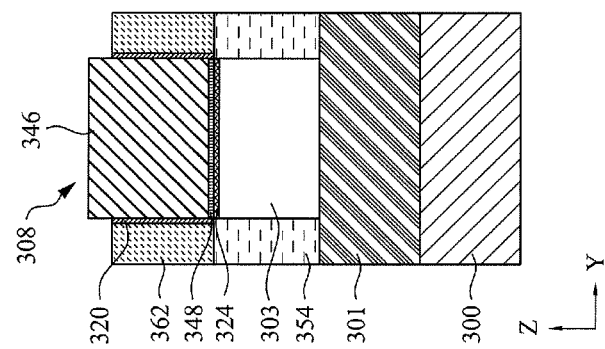
Figure 57C:
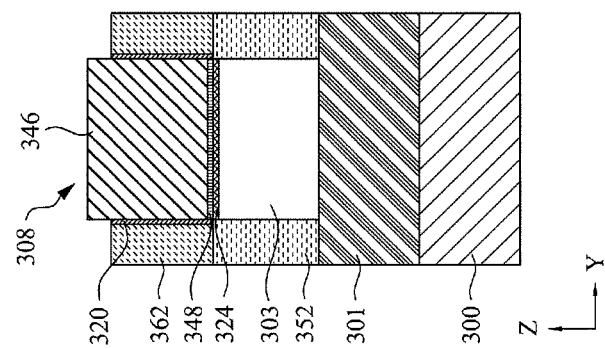

FIGS. 57A-57D depict a complementary metal-oxide-semiconductor (CMOS) device 350 according to an embodiment of the present disclosure. FIG. 57A is an isometric view of the semiconductor device, FIG. 57B is a cross section corresponding to line I-I' in FIG. 57A, FIG. 57C is a cross section corresponding to line J-J' in FIG. 57A, and FIG. 57D is a cross section corresponding to line K-K' in FIG. 57A.

Adverting to FIG. 57A, two transistors, an NFET 370 and a PFET 372, are formed on a semiconductor substrate (not shown). The NFET 370 and PFET 372 are separated from each other by an intervening insulating layer 360. Each transistor includes a fin 308 extending in a first direction (the J-J' and K-K' directions) and a gate electrode 346 overlying the fins 308 extending in a second direction (the I-I' direction). In some embodiments, the second direction is substantially perpendicular to the first direction. Each transistor includes a strain relaxed buffer layer 300 disposed on a semiconductor substrate (not shown). A stressor layer 301 is disposed over the strain relaxed buffer layer 300. NFET source/drain regions 352, and PFET source/drain regions 354 are located on each respective fin 308 on both sides of the gate electrodes 346 along the J-J' directions. Source/drain contacts 362 make electrical contact to the source/drain regions 352, 354 and insulating gate sidewall spacers 320 are disposed between the source/drain regions 352, 354 and the gate electrodes 346. In some embodiments, a metal silicide layer is disposed between the source/drain contacts 362 and the source/drain regions 352, 354.

In certain embodiments, the stressor layers 301 include GeSn or SiGeSn. In some embodiments, the stressor layer 301 includes GeSn or SiGeSn containing less than $10^{19}$ atoms cm$^{-3}$ of a dopant. In other embodiments, the stressor layer 301 includes GeSn or SiGeSn containing less than $10^{18}$ atoms cm$^{-3}$ of the dopant. The stressor layer 301 includes undoped GeSn or undoped SiGeSn in other embodiments. The dopants in the doped GeSn and SiGeSn are selected from the group consisting of gallium (Ga), boron (B), aluminum (Al), and indium (In) in certain embodiments.

In some embodiments, the strain relaxed buffer layer 300 includes $Si_{1-p-q}Ge_pSn_q$, where p ranges from 0 to 1, and $0 \leq q \leq 0.3$; the stressor layer 301 includes $Ge_{1-y}Sn_y$, where the $0 \leq y \leq 0.16$; and the channel regions 303 include $Ge_{1-x}Sn_x$, where x>y, and $0 \leq x \leq 0.07$ for an indirect band gap and $0.07 \leq x \leq 0.2$ for a direct band gap.

FIG. 57B is a cross section corresponding to line I-I' in FIG. 57A. As shown, a channel region 303 is disposed over the stressor layer 301 in a region of the fin 308 covered by the gate electrode 346. A passivation layer 324 is disposed covering the channel region 303 and a gate dielectric layer 348 is disposed between the passivation layer 324 and the gate electrode 346 in some embodiments. In some embodiments, the gate dielectric layer 348 is a high-k material including one or more layers of $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, or combinations thereof. The gate electrode 346 is a metal including one or more layers of Ti, TiN, titanium-aluminum alloy, Al, AlN, Ta, TaN, TaC, TaCN, and TaSi.

FIG. 57C is a cross section corresponding to line J-J' in FIG. 57A, and FIG. 57D is a cross section corresponding to line K-K' in FIG. 57A. As shown, the stressor layer 301 is disposed immediately below the channel region 303 and the source/drain regions 352, 354 in this embodiment.

FIGS. 58A-70B show exemplary sequential processes for manufacturing a CMOS device according to embodiments of the present disclosure. It is understood that operations for manufacturing the CMOS device may be the same as the operations disclosed herein for manufacturing semiconductor devices according to other embodiments. It is understood that additional operations can be provided before, during, and after processes shown by FIGS. 58A-70B, and some of the operations described below can be replaced or eliminated, for certain embodiments of the method. The order of the operations/processes may be interchangeable.

Figure 58A:
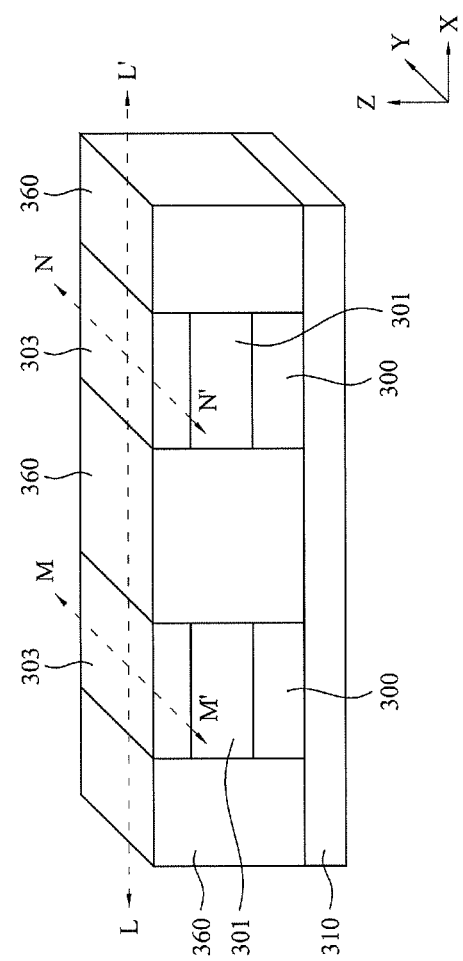
FIGS. 58A-70B depict a method for manufacturing a semiconductor device according to an embodiment of the present disclosure.

As shown in FIG. 58A, a strain relaxed buffer layer 300 is formed over a semiconductor substrate 310. In certain embodiments, the strain relaxed buffer layer 300 includes $Si_{1-x-y}Ge_xSn_y$, where $0 \leq x \leq 1$, $0 \leq y \leq 0.3$, and $x+y \leq 1$. In certain embodiments, the germanium concentration of the SiGe buffer layer increases from 30 atomic % at the bottom of the buffer layer to 70 atomic % at the top of the buffer layer.

A channel region 303 is formed over the buffer layer 300. In some embodiments, the channel region 303 is a lightly doped, n$^+$ doped or p$^+$ doped Ge, SiGe, GeSn, or SiGeSn formed by CVD, including LPCVD and PECVD, PVD, and ALD, or other suitable processes. The channel regions 303 for both subsequently formed NFET 370 and PFET 372 (see, FIGS. 70A and 70B) may be formed of the same material.

An insulating layer 360, such as shallow trench isolation layer is formed surrounding the strain relaxed buffer layer 300 and the channel region 303, thereby separating the regions where the NFET 370 and PFET 372 are to be subsequently formed. The insulating material for the insulating layer 360 may include silicon oxide, silicon nitride, silicon oxynitride (SiON), SiOCN, fluorine-doped silicate glass (FSG), or a low-k dielectric material, formed by LPCVD (low pressure chemical vapor deposition), plasma-CVD, flowable CVD, or other suitable operation. An anneal operation may be performed after the formation of the insulating layer 360.

Figure 58C:
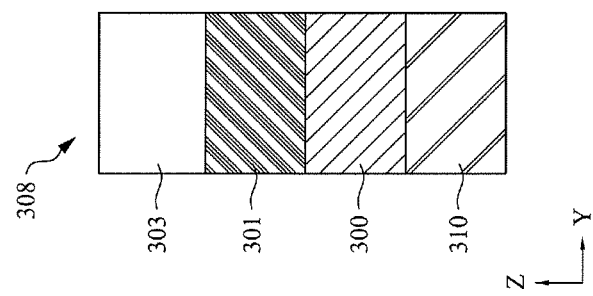
Figure 58B:
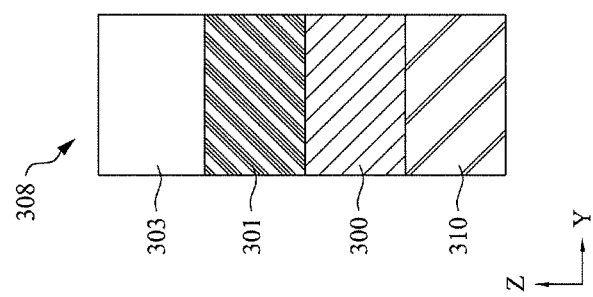
Figure 58D:
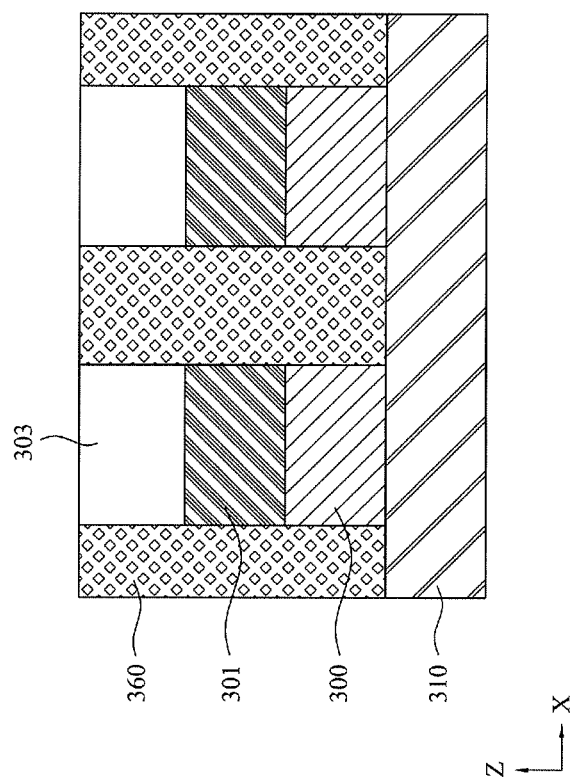

FIGS. 58B and 58C are cross sections of the fins 308 corresponding to lines M-M' and N-N' of FIG. 58A, respectively, and FIG. 58D is a cross section corresponding to line L-L' of FIG. 58A.

Figure 59:
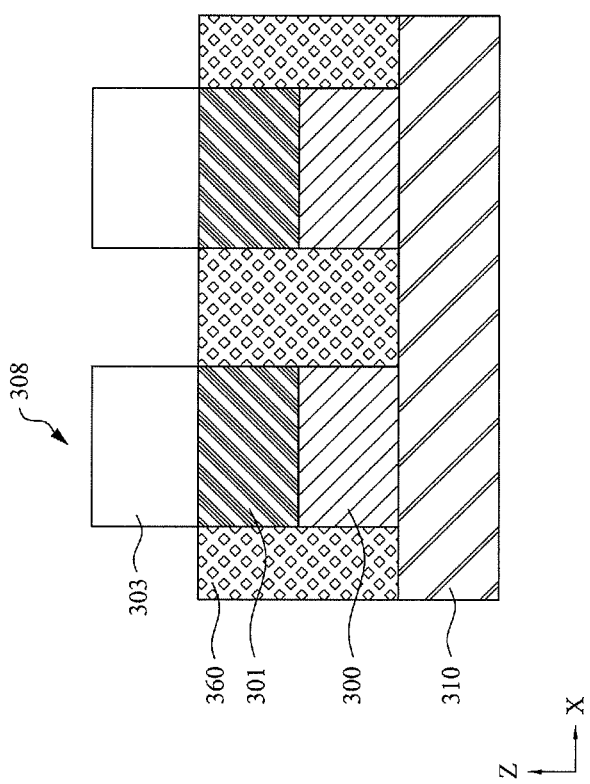
Figure 60A:
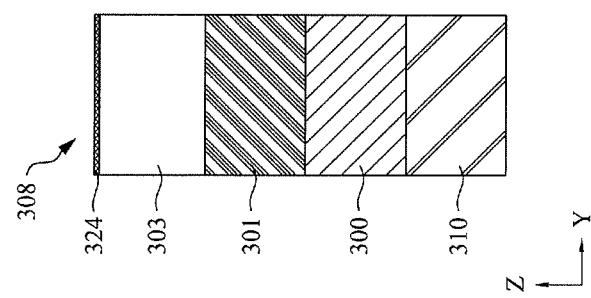
Figure 60B:
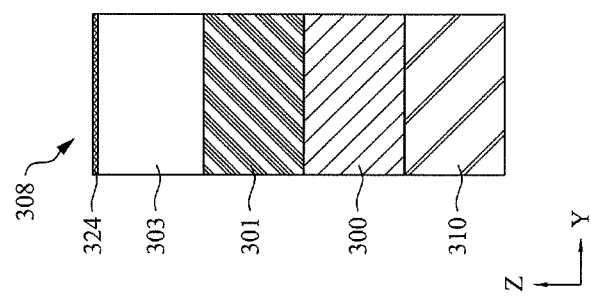
Figure 60C:
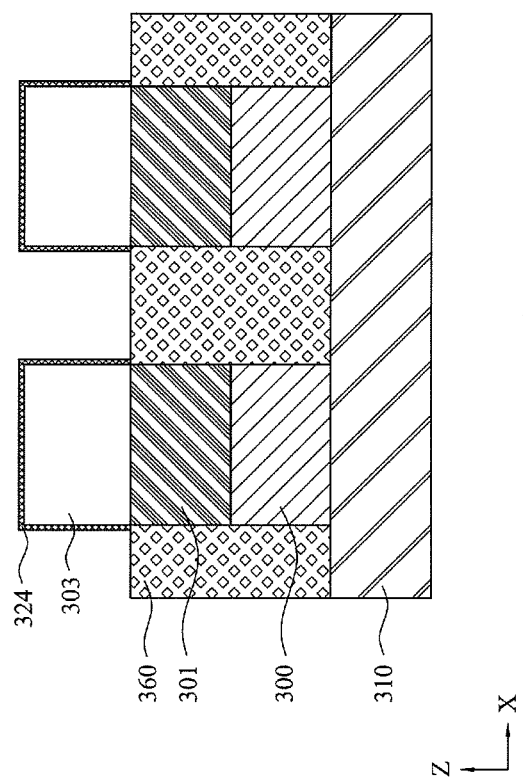

The insulating layer 360 is recess etched to expose the channel regions 303 of the fins 308 from the insulating layer 360, as shown in FIG. 59. A passivation layer 324 is subsequently disposed over the channel regions 303, as shown in FIGS. 60A-60C. FIG. 60A is a cross section view corresponding to line L-L' in FIG. 58A and FIGS. 60B and 60C are cross section views corresponding to lines M-M' and N-N' in FIG. 58A, respectively. In certain embodiments, the passivation layer 324 is a metal oxide layer having a thickness of at least 5 nm, formed by CVD, PVD, and ALD, or other suitable processes.

Figure 61A:
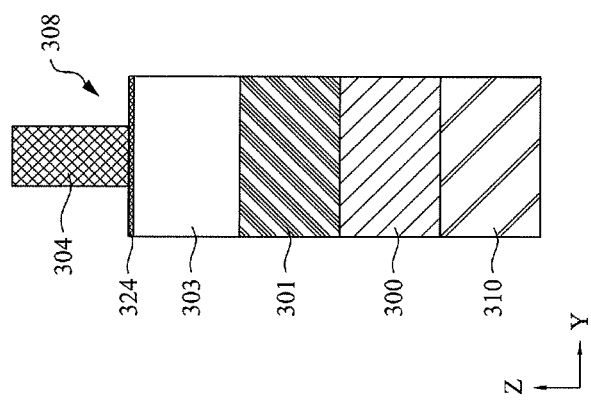
Figure 61B:
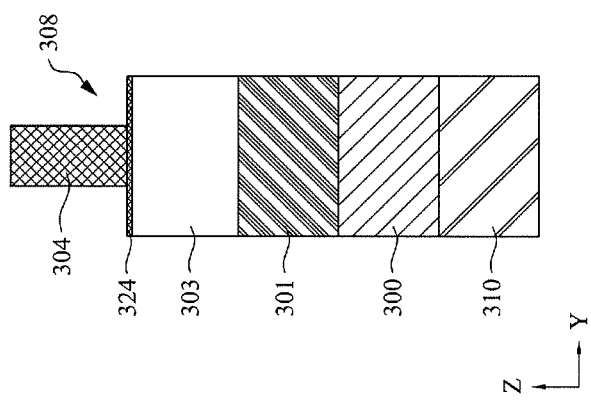
Figure 61C:
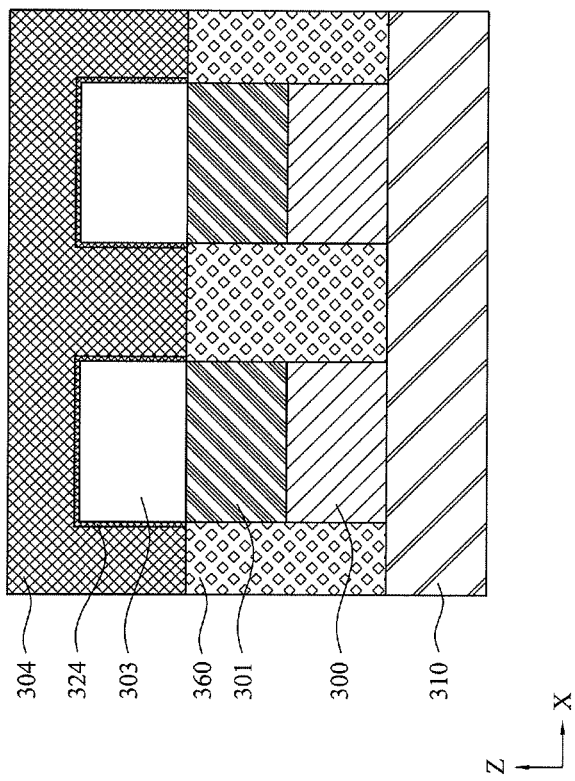

Dummy gate electrodes 304 are subsequently formed over the channel region 103 and the insulating layer 360, as shown in FIG. 61A, corresponding to line M-M' in FIG. 58A; FIG. 61B, corresponding to line N-N' in FIG. 58A; and FIG. 61C corresponding to line L-L' in FIG. 58A. The dummy gate electrode 304 may be formed by depositing a suitable gate electrode material, such as polysilicon, and patterning the deposited gate electrode material using photolithography and etching operations to provide the structure shown in FIGS. 61A-61C.

Figure 62A:
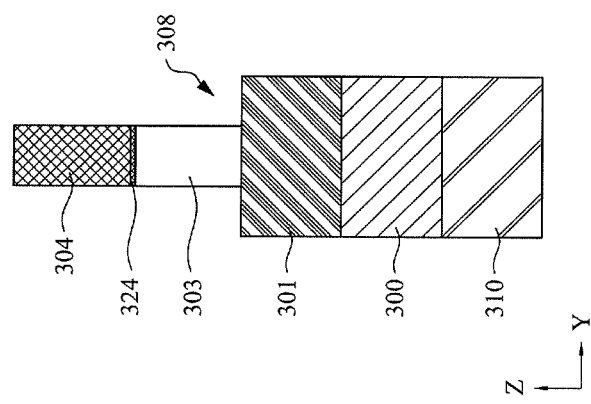
Figure 62B:
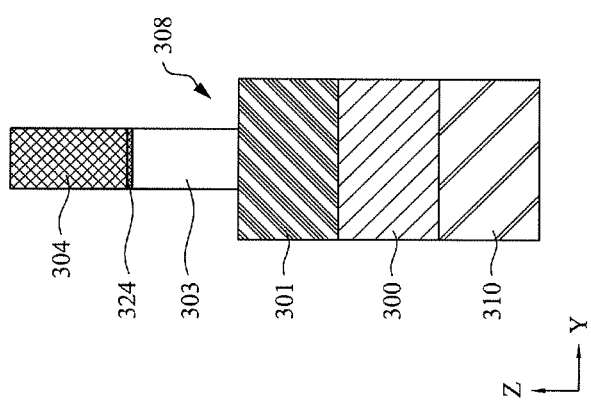
Figure 63B:
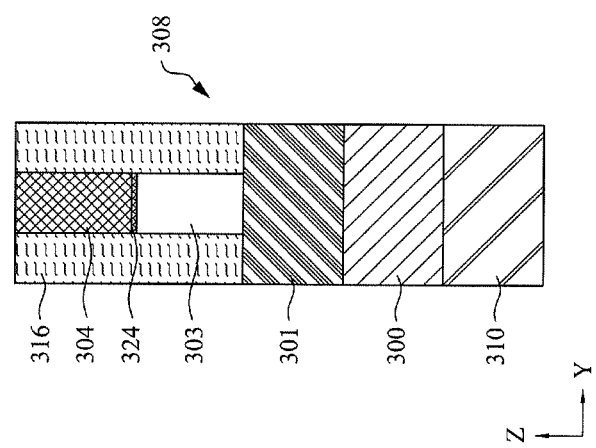
Figure 63A:
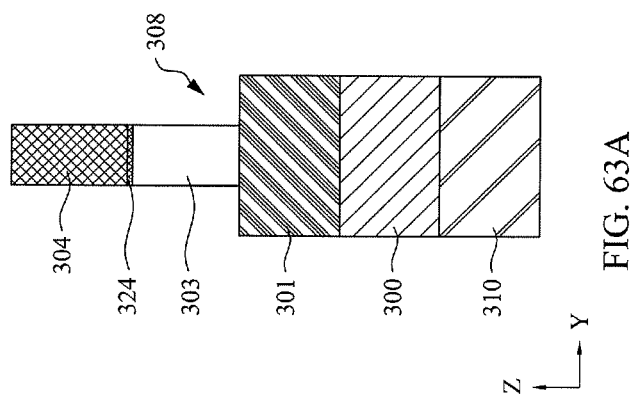
Figure 63D:
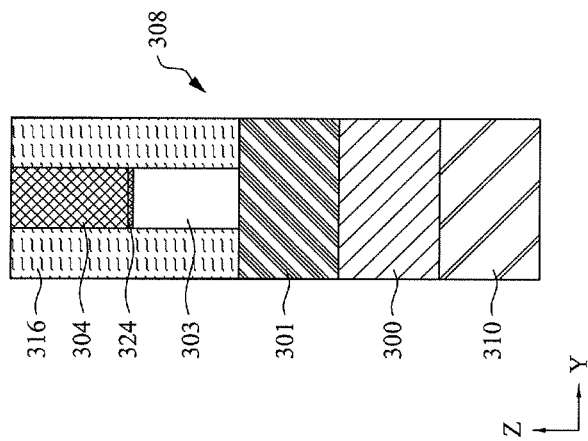
Figure 63C:
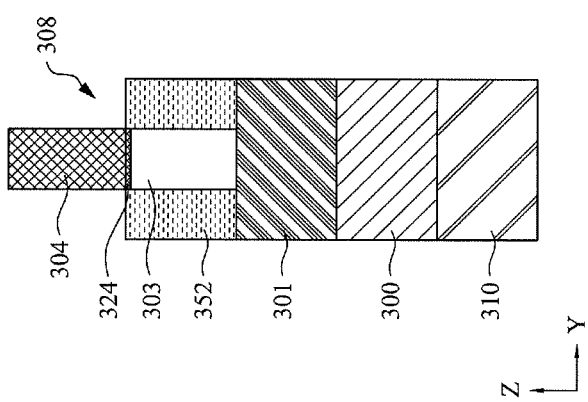

The passivation layer 324 channel region 303 are subsequently etched, as shown in FIG. 62A, corresponding to line M-M' in FIG. 58A; and FIG. 62B, corresponding to line N-N' in FIG. 58A. A mask 316 is formed on one of the fins 308 where the PFET 372 is to be formed, as shown in FIG. 63B, and exposing the fin 308 where the NFET 370 is to be formed, as shown in FIG. 63A. The mask 316 may be formed by depositing mask material over both the regions where the NFET 370 and PFET 372 are to be formed and then selectively removing the mask material from the region where the NFET 370 is to be formed by suitable lithographic and etching operations. Source/drain regions 352 are subsequently formed surrounding the channel region 303 of the exposed fin 308, as shown in FIGS. 63C and 63D, corresponding to lines M-M' and N-N' of FIG. 58A, respectively. The source/drain regions 352 include heavily doped regions of Ge or SiGe containing a dopant at a concentration of greater than $10^{20}$ atoms cm$^{-3}$ in certain embodiments. The source/drain regions 352 are formed by epitaxy in some embodiments.

Figure 64B:
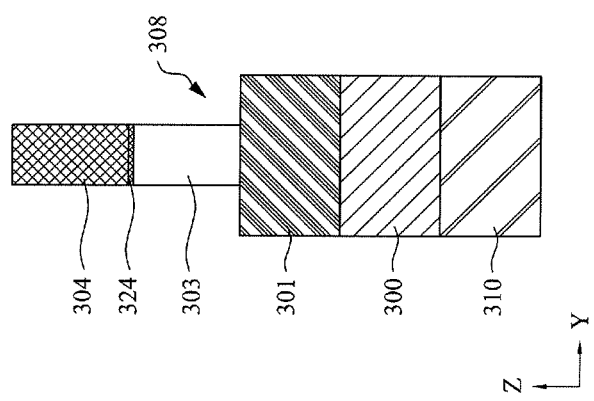
Figure 64A:
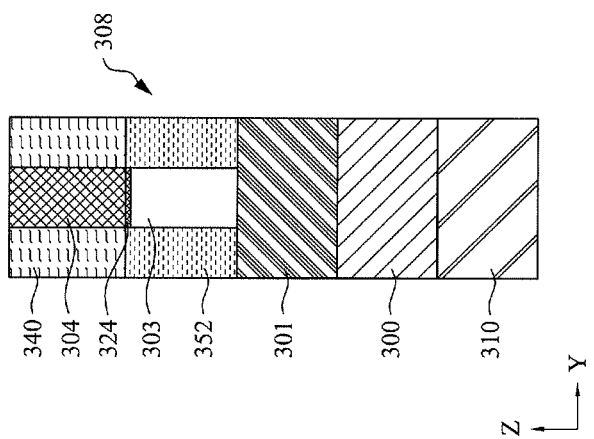
Figure 65B:
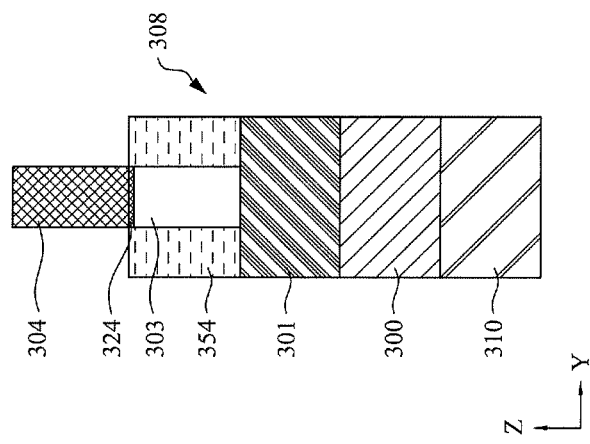
Figure 65A:
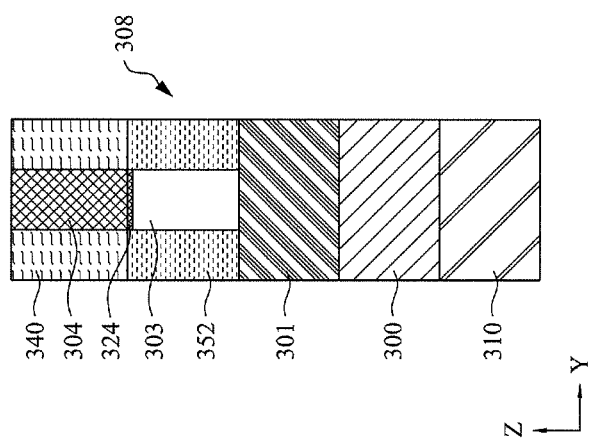
Figure 66B:
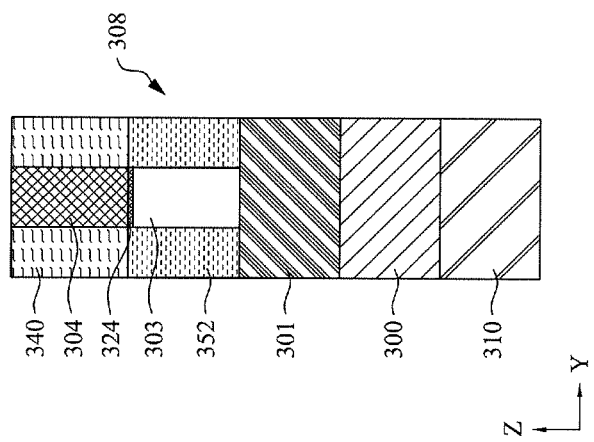
Figure 66A:
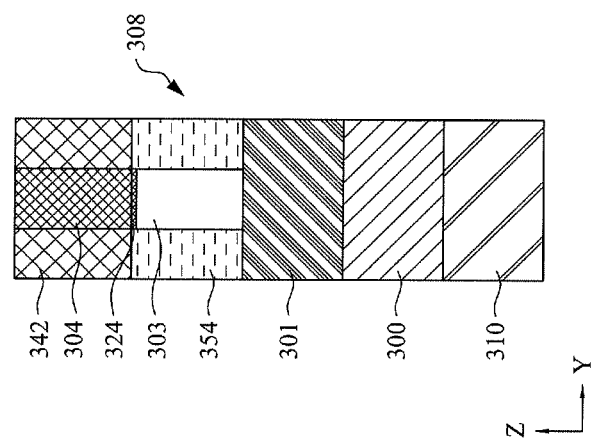

Adverting to FIGS. 64A and 64B, corresponding to lines M-M' and N-N' of FIG. 58A, the mask 316 is removed from the fin 308 where the PFET is to be formed, and a mask 340 is formed on the fin 308 where the NFET 370 is to be formed covering the NFET source/drain regions 352. The mask 340 may be formed by depositing mask material over both the regions where the NFET 370 and PFET 372 are to be formed and then selectively removing the mask material from the region where the PFET 372 is to be formed by suitable lithographic and etching operations. Source/drain regions 354 are subsequently formed surrounding the channel region 303 of the exposed fin 308 where the PFET 372 is to be formed, as shown in FIGS. 65A and 65B, corresponding to lines M-M' and N-N' of FIG. 58A. After forming the source/drain regions 354 of the PFET 372, a mask 342 is formed over the source/drain regions 354 so that the source/drain regions 352, 354 of both transistors are masked, as shown in FIGS. 66A and 66B corresponding to lines M-M' and N-N' of FIG. 58A, respectively.

Figure 67B:
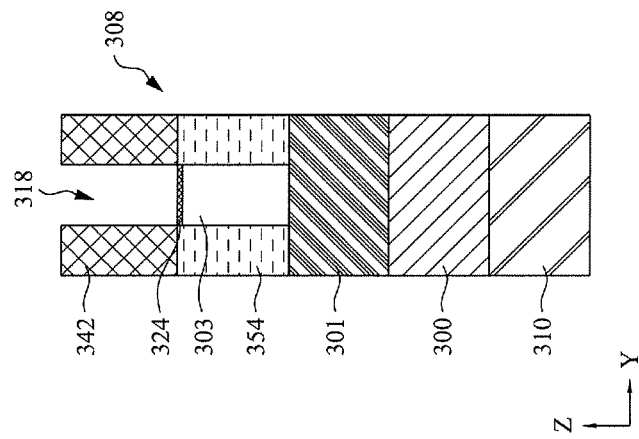
Figure 67A:
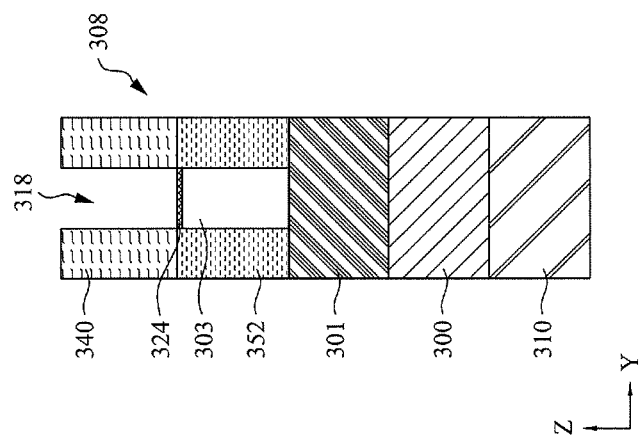
Figure 67C:
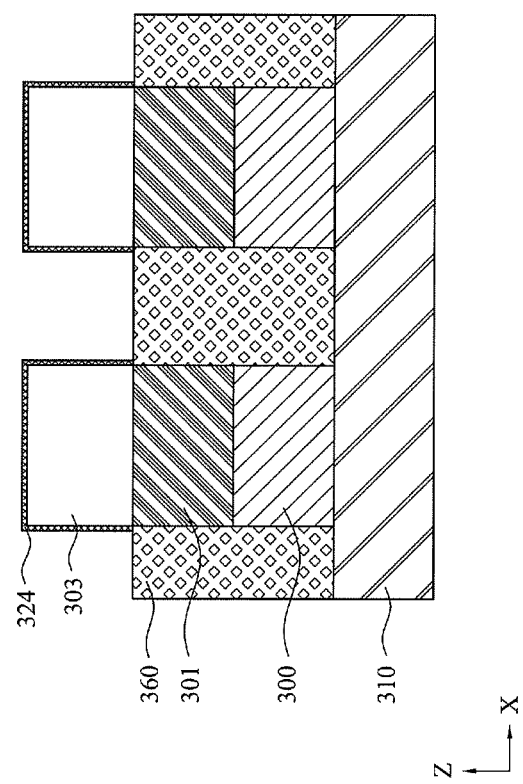
Figure 68B:
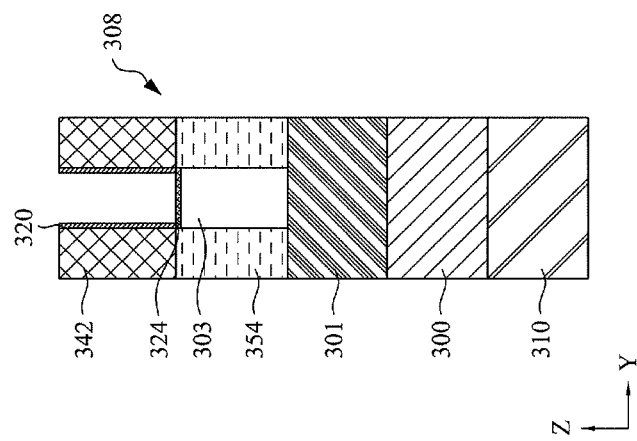
Figure 68A:
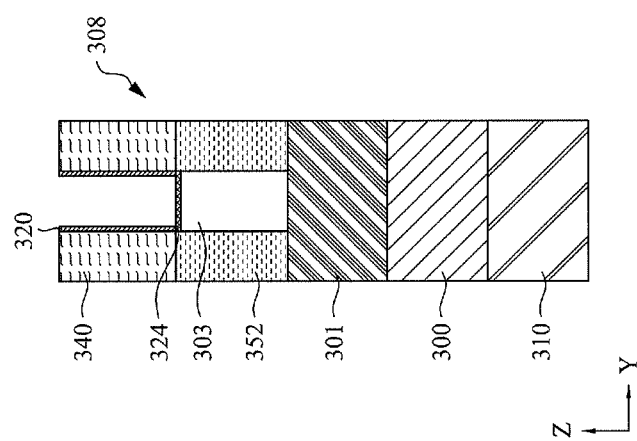

The dummy gate electrodes 304 are subsequently removed by an etching operation to form gate spaces 318, as shown in FIG. 67A, corresponding to line M-M' in FIG. 58A; FIG. 67B, corresponding to line N-N' in FIG. 58A; and FIG. 67C corresponding to line L-L' in FIG. 58A. Inner spacer layers 320 are formed on the sidewalls of the gate spaces 318 in the same manner as disclosed in reference to FIGS. 10A and 10B, as shown in FIG. 68A, corresponding to line M-M' of FIG. 58A, and FIG. 68B, corresponding to line N-N' of FIG. 58A. The inner spacer layers 320 are formed of an oxide or nitride, such as silicon oxide or silicon nitride in some embodiments. The inner spacer layers 320 laterally extending on the passivation layers 324 are removed by anisotropic etching leaving the inner spacer layer 320 remaining along the sidewalls of the gate space 318.

Figure 12B:
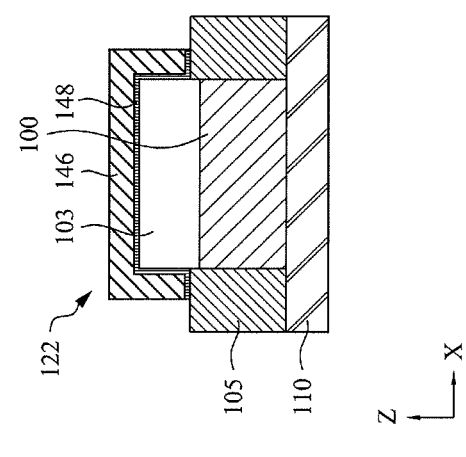
Figure 12A:
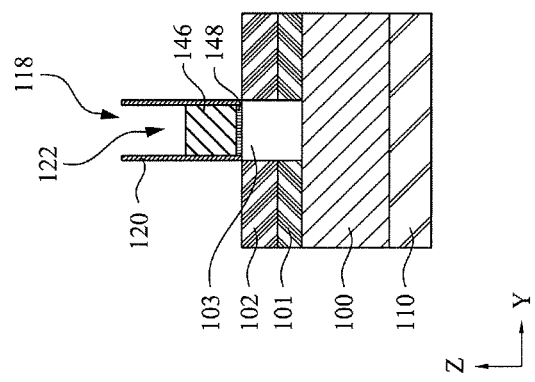
Figure 69B:
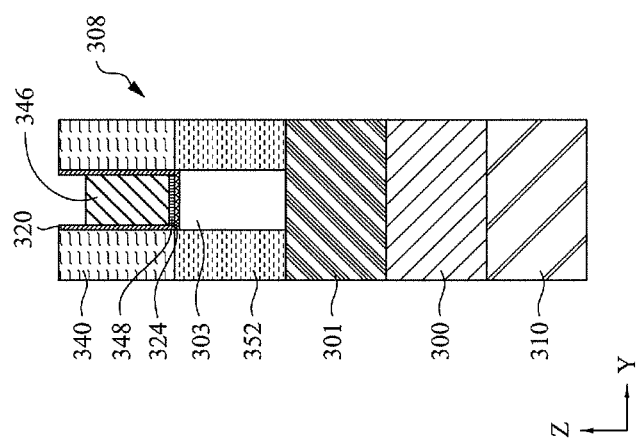
Figure 69A:
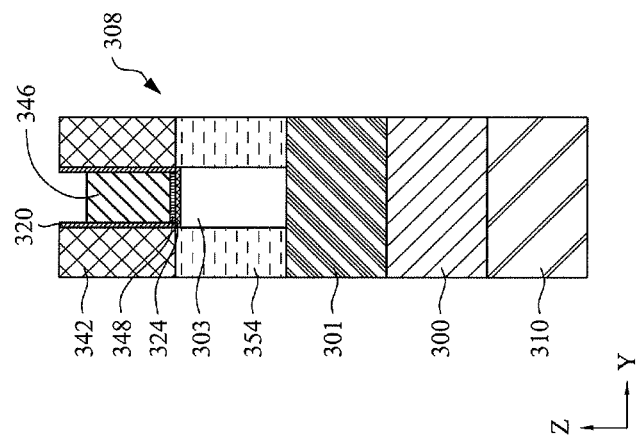
Figure 69C:
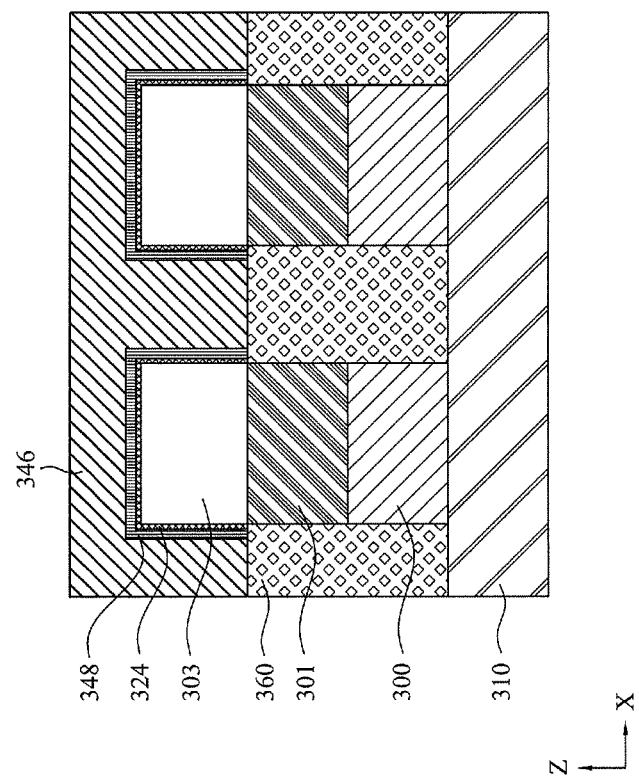

Adverting to FIGS. 69A-69C, a high-k gate dielectric layer 148 and metal gate electrode 146 are formed in the gate spaces 318 in the same manner as disclosed in reference to FIGS. 12A and 12B. The inner spacer layer 320 forms insulating gate sidewalls on opposing lateral surfaces of the gate electrode 346. FIG. 69A, corresponds to line M-M' in FIG. 58A; FIG. 69B, corresponds to line N-N' in FIG. 58A; and FIG. 69C corresponds to line L-L' in FIG. 58A.

Figure 70B:
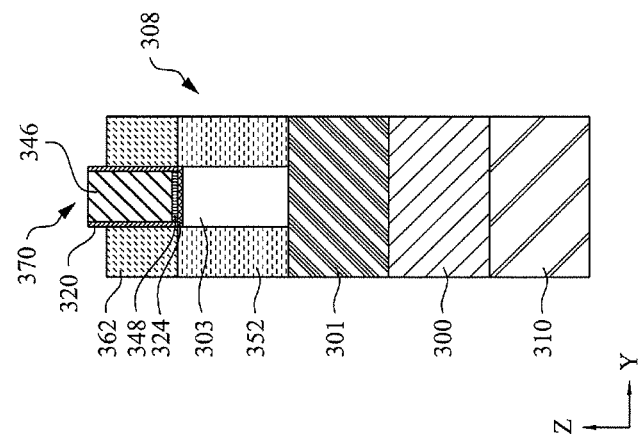
Figure 70A:
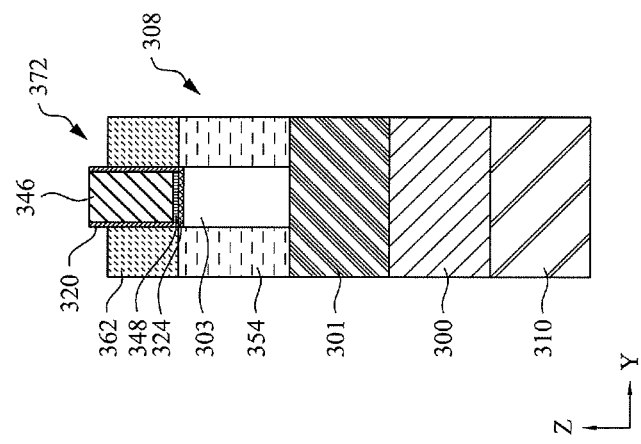

After forming the gate electrode 346, the masks 340, 342 on the source/drain regions 352, 354 are removed from by an etching operation, and source/drain contacts 362 are formed on the source/drain regions 352, 354, thereby providing a CMOS device including an NFET 370 and a PFET 372, as shown in FIGS. 70A and 70B corresponding to lines M-M' and N-N' of FIG. 58A.

CMOS devices formed according to the present disclosure provide high mobility and the same material may be used for the channels 303 in both the NFET 370 and PFET 372.

Semiconductor devices according to the present disclosure provide enhanced electron and hole mobility by forming the direct band gap and compressive strain on the channel region.

Processing of semiconductor devices according the present disclosure is simplified because the same channel material is used for both NFET and PFET devices.

In Ge-based NFETs, heavily doped stressor layers can be used, but the channel strain produced by the source/drain stressor is reduced with scaling lengths of the source/drains. In order to increase the channel <110> strain in small scaling lengths of the source/drains for NFETs, a fully strained GeSn or SiGeSn stressor layer can be used between channel region and the strain relaxed buffer layer.

In some embodiments, the lightly doped stressor layer 101 functions as a punch-through stopper.

Thus, it is seen that the length of the source/drain regions scaling reduces the <110> channel strain produced by the stressor layer, and the stressor layer enhances the <110> strain at small source/drain region lengths. The present disclosure provides increased tensile strain in the channel region thereby enhancing electron mobility by an additional stressor as the source/drain region stressor producing a small amount of strain into the channel when scaling the source/drain region length.

In some embodiments of the present disclosure, a structure of a GeSn or SiGeSn stressor for a Ge-based PFET provides low source/drain region resistance.

In certain embodiments of the present disclosure, a semiconductor device includes a fin extending along a first direction over a substrate, and a gate structure extending in a second direction overlying the fin. The gate structure includes a gate dielectric layer overlying the fin, a gate electrode overlying the gate dielectric layer, and insulating gate sidewalls on opposing lateral surfaces of the gate electrode extending along the second direction. A source/drain region is formed in the fin in a region adjacent the gate electrode structure, and a stressor layer is between the source/drain region and the semiconductor substrate. The stressor layer includes GeSn or SiGeSn containing $10^{19}$ atoms cm$^{-3}$ or less of a dopant, and a portion of the fin under the gate structure is a channel region.

In another embodiment of the disclosure, a complementary metal-oxide-semiconductor (CMOS) device includes a p-type field effect transistor (PFET) and an n-type field effect transistor (NFET) formed on a semiconductor substrate. The PFET and the NFET each include a fin extending along a first direction over a substrate, and a gate structure extending in a second direction overlying the fin. The gate structure includes a gate dielectric layer overlying the fin, a gate electrode overlying the gate dielectric layer, and insulating gate sidewalls on opposing lateral surfaces of the gate electrode extending along the second direction. A portion of the fin under the gate structure is a channel region. A source/drain region is in the fin in a region adjacent the gate electrode structure, and a stressor layer is between the channel region and the semiconductor substrate. The stressor layer includes GeSn or SiGeSn containing about $10^{19}$ atoms cm$^{-3}$ or less of a dopant. A strain relaxed buffer layer is between the stressor layer and the semiconductor substrate. The PFET and NFET are spaced apart from each other with an insulating layer there between.

Another embodiment of the present disclosure is a method for manufacturing a semiconductor device. The method includes forming one or more fins extending in a first direction over a substrate. The one or more fins include at least one first region along the first direction and second regions on either side of each first region along the first direction. The first region is a channel region. A gate structure is formed extending along a second direction overlying the first region of the fins. The gate structure includes a gate dielectric layer overlying the fin, a gate electrode overlying the gate dielectric layer, and a pair of insulating gate sidewalls formed on opposing lateral surfaces of the gate electrode extending along the second direction. A stressor layer is formed on the semiconductor substrate, and source/drain regions are formed in the second regions of the fin. The stressor layer is located between either the source/drain region and the semiconductor substrate or between the channel region and the semiconductor substrate, and the stressor layer includes GeSn or SiGeSn containing about $10^{19}$ atoms cm$^{-3}$ or less of a dopant.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a fin extending along a first direction over a semiconductor substrate;
a gate structure extending in a second direction overlying the fin,
wherein the gate structure comprises:
a gate dielectric layer overlying the fin;
a gate electrode overlying the gate dielectric layer; and
insulating gate sidewalls on opposing lateral surfaces of the gate electrode extending along the second direction;
a source/drain region in the fin in a region adjacent the gate structure,
wherein the source/drain region consists essentially of Ge or SiGe and a first dopant; and
a stressor layer between the source/drain region and the semiconductor substrate,
wherein the stressor layer includes GeSn or SiGeSn containing $10^{19}$ atoms cm$^{-3}$ or less of a second dopant, and
a portion of the fin under the gate structure is a channel region.

2. The semiconductor device of claim 1, wherein the stressor layer comprises GeSn or SiGeSn containing less than $10^{18}$ atoms cm$^{-3}$ of the second dopant.

3. The semiconductor device of claim 1, wherein the stressor layer comprises undoped GeSn or undoped SiGeSn.

4. The semiconductor device of claim 1, wherein the channel region comprises Ge, SiGe, GeSn, or SiGeSn.

5. The semiconductor device of claim 1, wherein the stressor layer extends along sidewalls of the channel region forming an L-shaped stressor layer.

6. The semiconductor device of claim 1, further comprising a strain relaxed buffer layer between the stressor layer and the semiconductor substrate.

7. The semiconductor device of claim 6, wherein the stressor layer is embedded in the strain relaxed buffer layer.

8. The semiconductor device of claim 6, wherein the channel region overlies the strain relaxed buffer layer and the stressor layer extends along sidewalls of the channel region.

9. The semiconductor device of claim 6, wherein the strain relaxed buffer layer comprises Ge, SiGe, SiGeSn, or GeSn.

10. The semiconductor device of claim 1, wherein a concentration of the first dopant in the source/drain region is greater than $10^{20}$ atoms cm$^{-3}$.

11. A semiconductor device comprising:
a fin extending along a first direction over a semiconductor substrate;
a gate structure extending in a second direction overlying the fin,
wherein the gate structure comprises:
a gate dielectric layer overlying the fin; and
a gate electrode overlying the gate dielectric layer;
source/drain regions consisting essentially of Ge or SiGe and a first dopant in the fin on opposing sides of the gate structure,
wherein the gate dielectric layer is located above the source/drain regions;
stressor layers including GeSn or SiGeSn and a second dopant between the source/drain regions and the semiconductor substrate; and
a channel region immediately adjacent the stressor layers and under the gate structure.

12. The semiconductor device of claim 11, wherein an upper surface of the gate dielectric layer is located a further distance from the semiconductor substrate than an upper surface of the source/drain regions.

13. The semiconductor device of claim 11, wherein the first dopant is Ga or B and the second dopant is Ga, B, Al, or In.

14. The semiconductor device of claim 11, further comprising a strain relaxed buffer layer between the stressor layer and the semiconductor substrate.

15. The semiconductor device of claim 14, wherein the strain relaxed buffer layer includes $Si_{1-x-y}Ge_xSn_y$, wherein x ranges from 0.3 in a portion of the strain relaxed buffer layer adjacent the semiconductor substrate to 0.7 in a portion of the strain relaxed buffer layer adjacent the stressor layer, and $x+y \leq 1$.

16. A semiconductor device comprising:
a fin extending along a first direction over a semiconductor substrate;
a gate structure extending in a second direction overlying the fin,
wherein the gate structure comprises:
a gate dielectric layer overlying the fin;
a gate electrode overlying the gate dielectric layer; and
insulating gate sidewalls on opposing lateral surfaces of the gate electrode extending along the second direction,
wherein a portion of the fin under the gate structure is a channel region;
a source/drain region in the fin in a region adjacent the gate structure,
wherein the source/drain region includes a source/drain layer, and
the source/drain layer consists essentially of Ge or SiGe and a first dopant; and
an L-shaped stressor layer made of GeSn or SiGeSn,
wherein the L-shaped stressor layer has a bottom portion and an upper portion,
wherein the bottom portion of the L-shaped stressor layer is between the source/drain layer and the semiconductor substrate, and
the upper portion of the L-shaped stressor layer extends vertically between the source/drain layer and the channel region from the bottom portion of the L-shaped stressor layer to an upper surface of the source/drain layer.

17. The semiconductor device of claim 16, wherein the upper portion of the L-shaped stressor layer is vertically aligned with an outer side surface of the insulating gate sidewalls.

18. The semiconductor device of claim 16, wherein the first dopant is Ga or B.

19. The semiconductor device of claim 16, further comprising a strain relaxed buffer layer between the stressor layer and the semiconductor substrate.

20. The semiconductor device of claim 19, wherein the strain relaxed buffer layer includes $Si_{1-x-y}Ge_xSn_y$, wherein x ranges from 0.3 in a portion of the strain relaxed buffer layer adjacent the semiconductor substrate to 0.7 in a portion of the strain relaxed buffer layer adjacent the stressor layer, and $x+y \leq 1$.

* * * * *